United States Patent [19]
Malm et al.

[11] Patent Number: 5,043,920
[45] Date of Patent: Aug. 27, 1991

[54] MULTI-DIMENSION VISUAL ANALYSIS

[75] Inventors: Richard L. Malm; Charles L. Meiley, both of San Jose, Calif.

[73] Assignee: International Business Machines Corporation, Armonk, N.Y.

[21] Appl. No.: 410,180

[22] Filed: Sep. 20, 1989

[51] Int. Cl.⁵ ............................................. G06F 15/60
[52] U.S. Cl. ..................................... 364/521; 364/488; 364/489; 364/518; 340/705; 340/729; 434/224
[58] Field of Search ............... 364/200, 900, 488, 490, 364/491, 489, 518, 522, 521, 578; 340/729, 705; 434/224

[56] References Cited

U.S. PATENT DOCUMENTS

| | | | |
|---|---|---|---|
| 4,250,562 | 2/1981 | Haag et al. | 364/900 |
| 4,303,987 | 12/1981 | Haag et al. | 364/900 |
| 4,675,832 | 6/1987 | Robinson et al. | 364/488 X |
| 4,817,012 | 3/1989 | Cali | 364/488 |

Primary Examiner—Bernarr E. Gregory
Attorney, Agent, or Firm—L. Keith Stephens

[57] ABSTRACT

An improved technique for processing large amounts of information and displaying that information graphically. The graphic display focuses attention to suspect areas employing colors and shading techniques to quickly focus the user's attention to problem areas. Multidimensional objects clearly convey global information concerning circuits employing millions of networks of electrical characteristics.

22 Claims, 8 Drawing Sheets

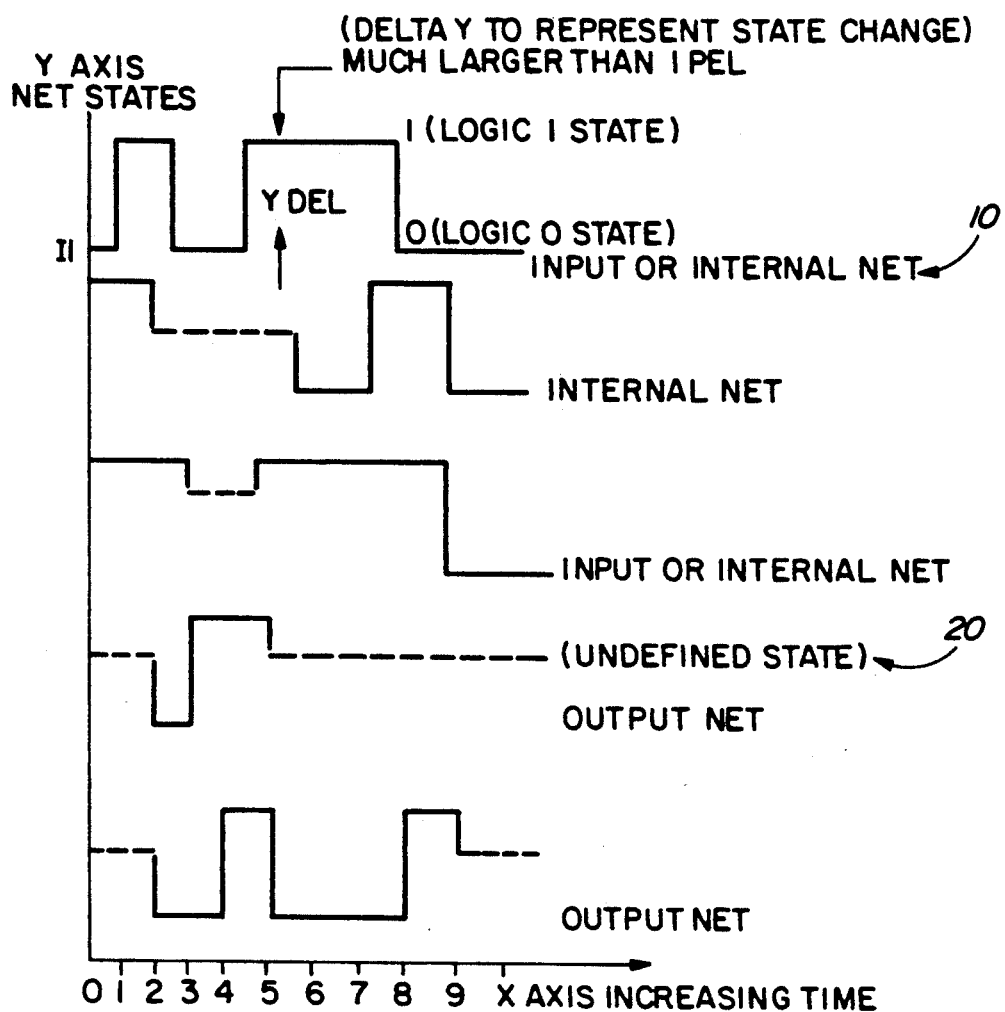
EXAMPLE OF A DISPLAY OF NETS (PRIOR ART)
FIG. 1
FIG. 12

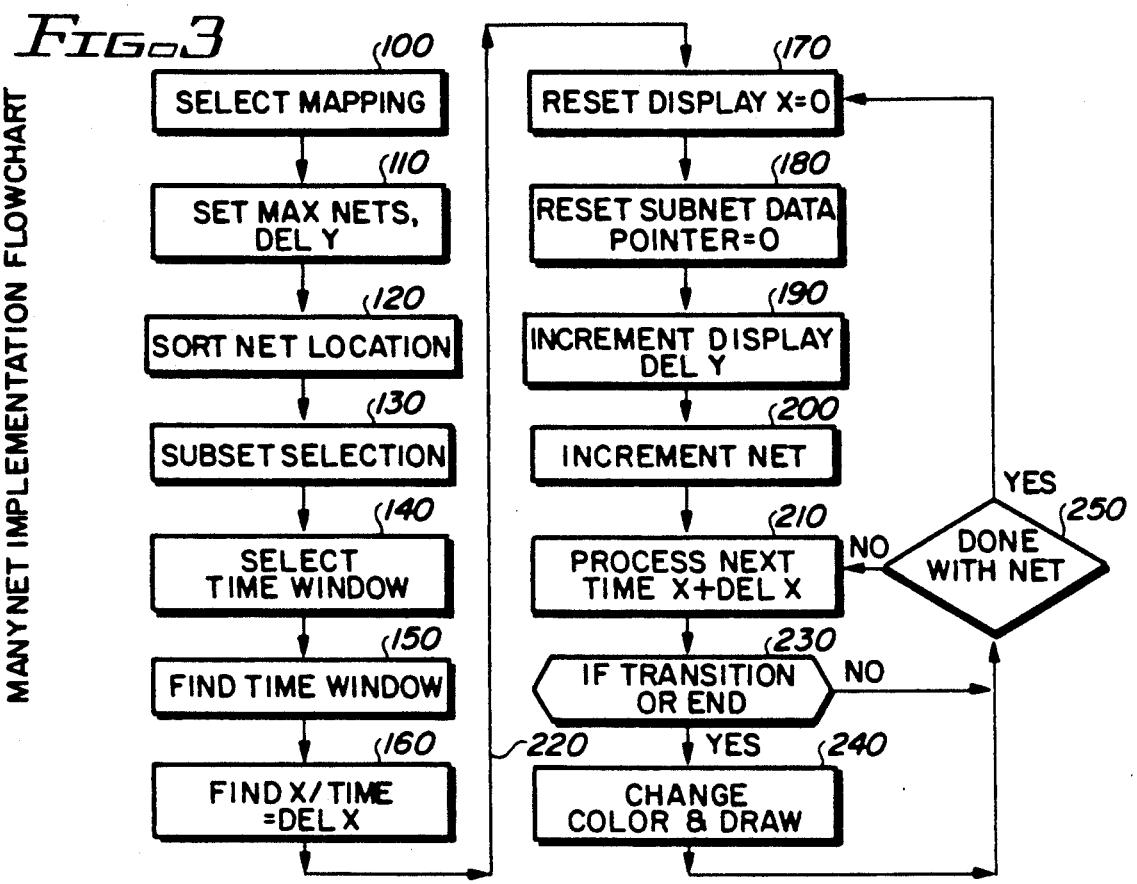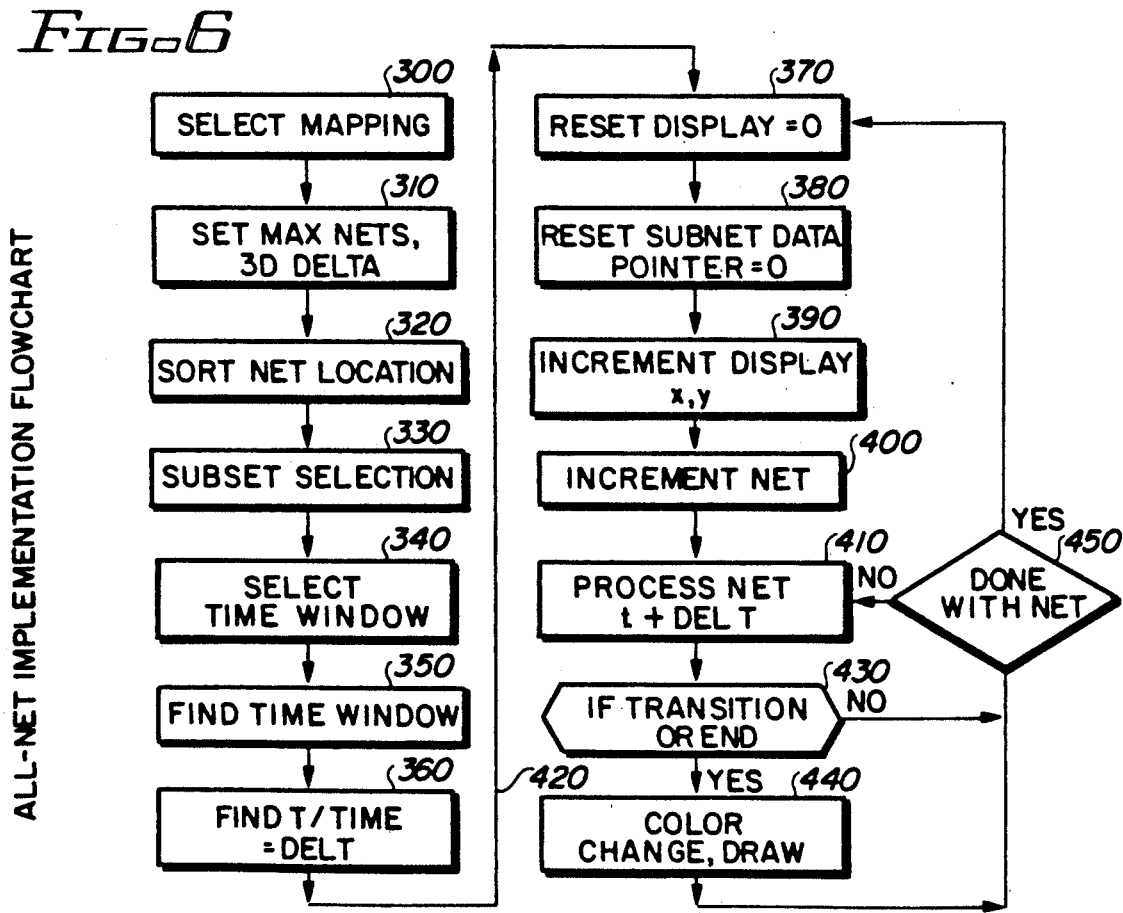

MULTI-DIMENSION VISUAL ANALYSIS

FIELD OF THE INVENTION

This invention generally relates to improvements in design analysis of logic and circuit simulators and more particularly to a technique that employs multi-dimensional visualization techniques to analyze and display large volumes of data more effectively.

DESCRIPTION OF THE INVENTION

High speed logic and circuit simulators are used throughout the computer industry to aid in the design of complex systems. High performance simulators generate enormous amounts of data making storage of the information impractical. In order to pinpoint problems effectively, the information must be displayed to the designer as it is generated. However, current technology only allows the information to be presented in the form of waveforms, tables or compared to known values to detect problems. A prior art technique for analyzing information on a computer channel is disclosed in U.S. Pat. No. 4,773,003. This patent detects a preselected signal line event and displays the information on a two-dimensional display for further manual analysis.

VLSI designers have difficulty trying to debug designs when a large amount of information is displayed without trend or summary information. For example, it is very difficult for a designer to analyze the effect of power reset on all macros. The source of a problem is often very difficult to trace to its cause. A typical network predecessor tree for the problem just described can be very large and quite deep. The tree also grows quickly to obscure the source of the problem further.

State of the art waveform displays help the designer in the analysis of networks. However, they only focus on one aspect of the problem at a time and have no capability for correlating multiple functions to decipher the common source of the problem.

Waveform programs are offered by many of the Engineering Design Association (EDA) vendors such as the LSIM simulator, ZYCAD, IKOS and Mentor. A standard approach plots the information on two-dimensional waveforms for each net as a function of time. The plots are displayed on a graphics device for further manual interrogation. As many as fifty nets are plotted in the vertical direction while time is plotted from an origin of zero at the extreme left-hand side. FIG. 1 shows an example of a prior art net display. To debug many networks and visualize the simulation information globally, a new approach is necessary.

SUMMARY OF THE INVENTION

The invention consists of a computer and graphics display for processing large amounts of information and displaying that information graphically. Software processing of the information and graphic display of the processed information focuses attention to suspect areas employing colors and shading techniques to quickly call the user's attention to problem areas.

BRIEF DESCRIPTION OF THE DRAWINGS

The foregoing and other objects, aspects and advantages of the invention will be better understood from the following detailed description of the preferred embodiment of the invention with reference to the accompanying drawings, in which:

FIG. 1 shows a prior art example of a waveform display of nets;

FIG. 3 is a flowchart showing the logic for implementing a many net display in accordance with the present invention;

FIG. 6 is a flowchart showing the logic for implementing an all nets display in accordance with the present invention;

FIG. 12 is a block diagram of the hardware in accordance with the subject invention.

DETAILED DESCRIPTION OF THE INVENTION

Starting with the simple two-dimensional multiple net display as shown in FIG. 1, a simple initial step entails the compression of the vertical plots until all plots are compressed. Thus, the transition from the lowest state to the highest state would be shown as a line color change not a vertical deflection of a polygon waveform. As more and more net states are plotted on one screen, the limiting factor is the number of scan lines on the display. The limit is reached when the logic states are represented by a single pel or line of pels and encoded using color as a differentiating factor.

Figure 2A:
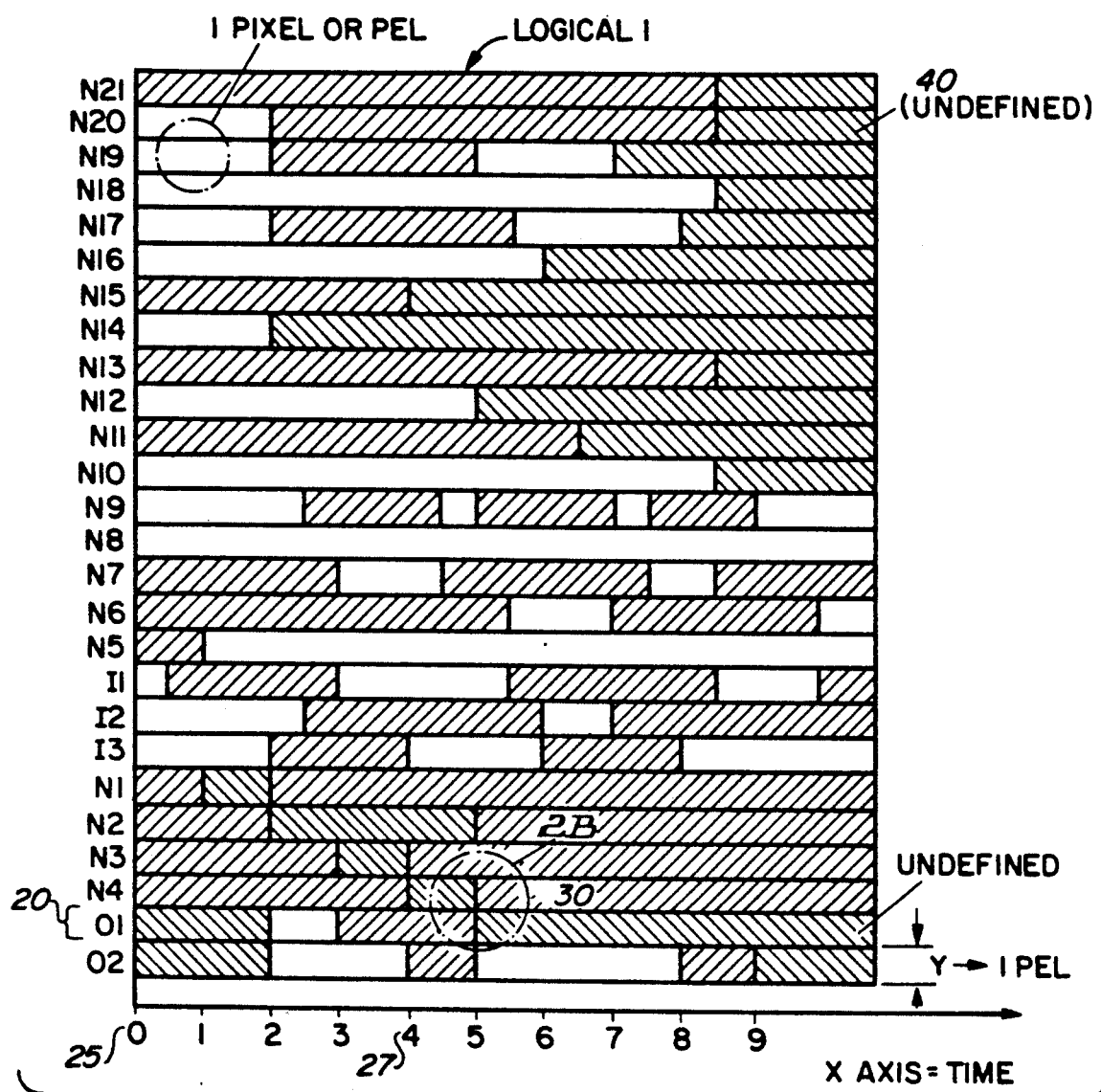
FIG. 2a is an illustration of a many net display in accordance with the invention.
Figure 2B:
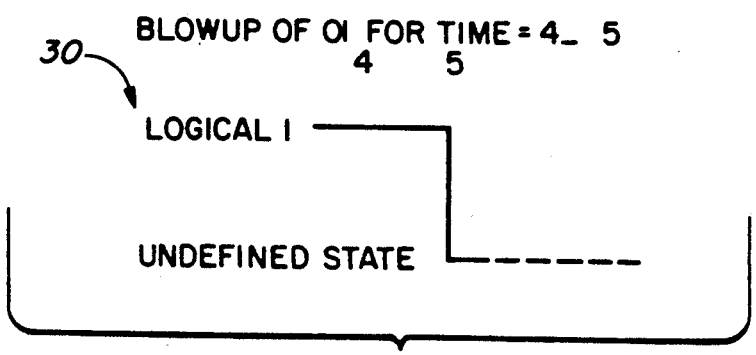
FIG. 2b is a blowup of a waveform display of one network of a many net display in accordance with the invention.

The waveform of the clock net in FIG. 1, net 10, required one-hundred pixels to show the logic state transition. Employing the technique just described, the rise and fall transition of network 20 in FIG. 1 is represented in FIG. 2 by color differences on one horizontal scan line. Two green pixels are indicative of the down state, then four red pixels for the undefined state and four blue pixels for the up state. The green pixels are represented in FIG. 2 by white square areas, while the red pixels are represented by lighter shades of grey, and the blue pixels are represented by black areas in FIG. 2.

In FIG. 2 time is plotted on the X-axis while each line of the Y-axis is a separate net. So, for example, at 30 a transition from logical high to undefined is indicated by the black area changing to grey. In FIG. 2, each net occupies a single scan line. Thus, a group of undefined nets would be visible as a red area 40 on the display.

The resulting display has patches of color that change from left to right as the simulation proceeds in time. By allowing the user to select the vertical order of the net display, for example net predecessor, net successor, or distance from input or output port, various images are created to enhance the visualization process.

Referring to FIG. 2, an output net appears near the bottom 20. The output nets 20 is undefined at time zero 25, but become defined by time four 27. The net represents a typical power reset problem of a microcomputer or a fetch to an invalid address. A user notes that the net becomes undefined at time five 30, but the cause is not apparent based on the display in FIG. 1. Using techniques of the prior art, such as the waveforms illustrated in FIG. 1, the user would have to select the specific output net, and then begin his trace backwards through multiple windows and networks. In FIG. 2, the capacity to visualize many more networks enables a comprehensive view of a plurality of networks and the ability to pinpoint the source of an error quickly and accurately.

Many line drawing routines are presently available for implementing the line drawing calls of the invention. Packages such as the Graphics Programmer's Hierarchical Interactive Graphic System (Graphics) or the IBM 3277 Graphics Attachment PRQ described in IBM publication SH20-2137 provide the type of graphics support necessary to implement the invention. The graphic packages are designed to execute on a variety of standard processors and displays such as IBM's PC/RT with corresponding high resolution graphic's display or the IBM 5085 controller attached to a System/370 Host to drive an IBM 5080 display as shown in FIG. 12.

The logic for implementing the invention is displayed in FIG. 3. In function block 100, the mapping of the network is determined. Information pertaining to the color or intensity of each electrical state and the maximum number of nets to display in the raster image is predefined by the user in conjunction with function block 110. Then, the net locations are allocated by logical or physical nearest neighbors in function block 120. The user must then select the subset of nets that can be displayed on the display in function block 130.

The time window of interest is selected next in function block 140. Then the number of time steps is calculated in function block 150, and the delta movement in the horizontal direction for each step is calculated in function block 160.

A loop is used to process each net data simulation as time elapses commencing at function block 170 where the display is reset for the particular horizontal (x) coordinate. Function block 180 resets the subnet data pointer to the start of the left side of the display and function block 190 increments the display to the next vertical (y) location for displaying the next net's state. The net is incremented in function block 200 to get the next net simulation information.

Then an inner loop is entered at function block 210 for processing the net transition information. Function block 210 increments through the transition information until the net is completed as tested in decision block 250. A test for a transition in the net data is performed at decision block 220 and the information is plotted at 240 if a transition is detected in decision block 230.

Following the plot step at function block 240, or a detection of no transition at decision block 230, control returns to decision block 250 to determine if the net processing is complete. If it is not, then control returns to the inner loop at function block 210 to continue to process net information. If it is complete, then control returns to function block 170 to increment to the next net. Processing continues until the information is halted or the process is interrupted.

The many nets display allows a designer to look at large chip macros that get a summary of its behavior by looking at one graphic image. Although, the many nets display just described is helpful, most system designs exceed one-thousand nets. Thus, a user would have to page through tens or hundreds of many net displays to attempt to get the overall view or find exception conditions. This is impractical.

To see the global view of the system, the nets must be represented by a three-dimensional volume in space and time on the graphic display. The three-dimensional volume draws the net as a line in three-dimensional space with color changes for state transitions.

Figure 4A:
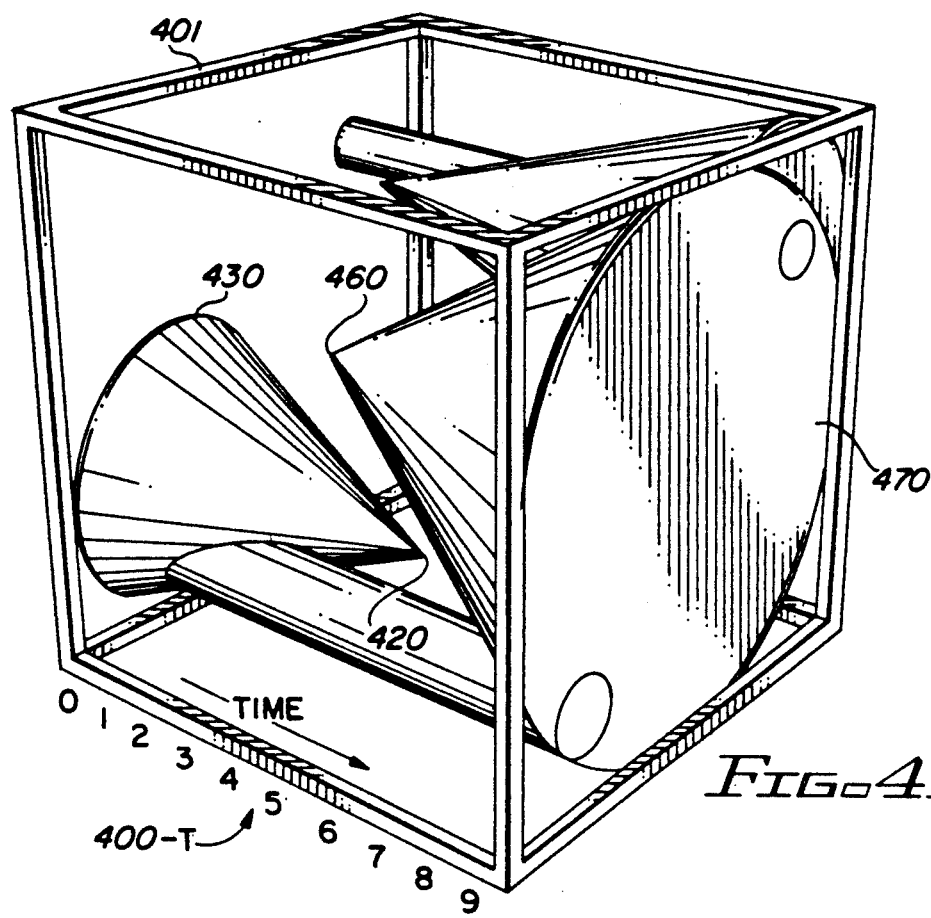
FIG. 4a depicts an all nets displays in accordance with the present invention.

In some of the following figures the line that represents a net's state is drawn as a large cylinder with a radius that is a function of how many nets one would like to display at one time just like in the many net display where the lines have a width which is a function of the number of nets to be displayed. An example is FIG. 4a which depicts the all nets display for the preceding example. The display can be panned by net face of the cube to a time T 400. Notice that at time (T) the last net that commenced in an undefined state reaches a defined state at the tip 420 of the cone 430.

Figure 4B:
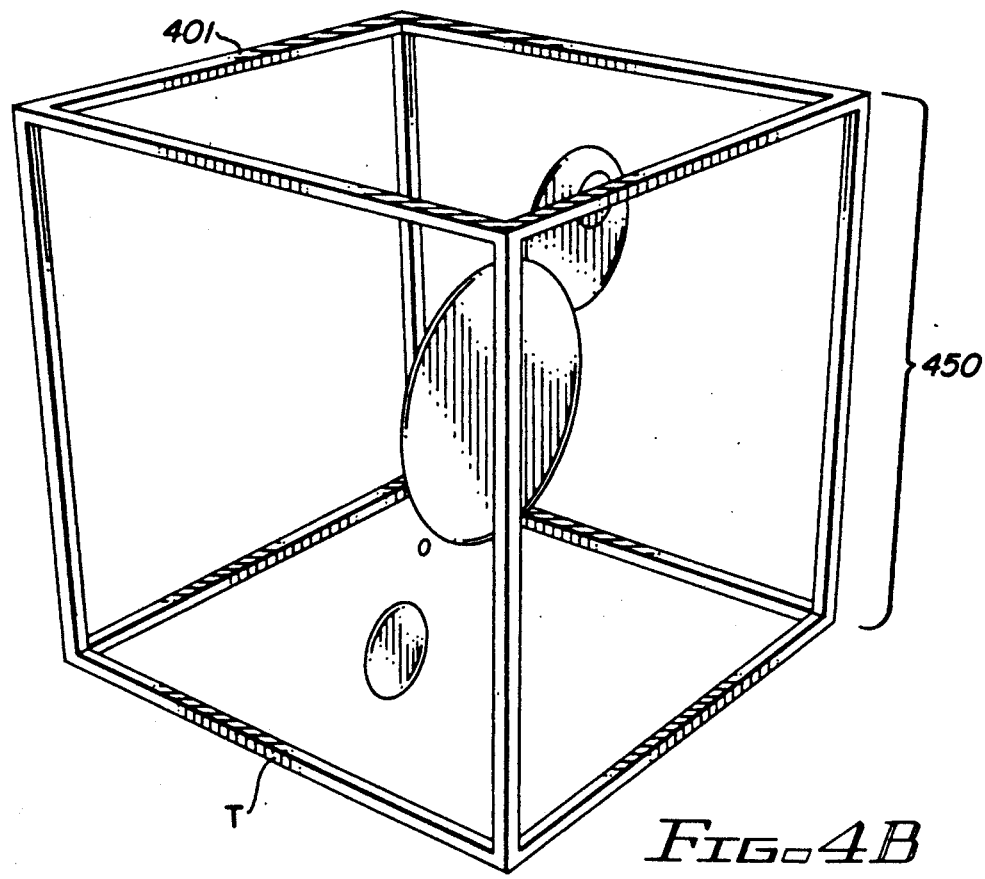
FIG. 4b depicts an all nets displays at Time (T) in accordance with the present invention.
Figure 4C:
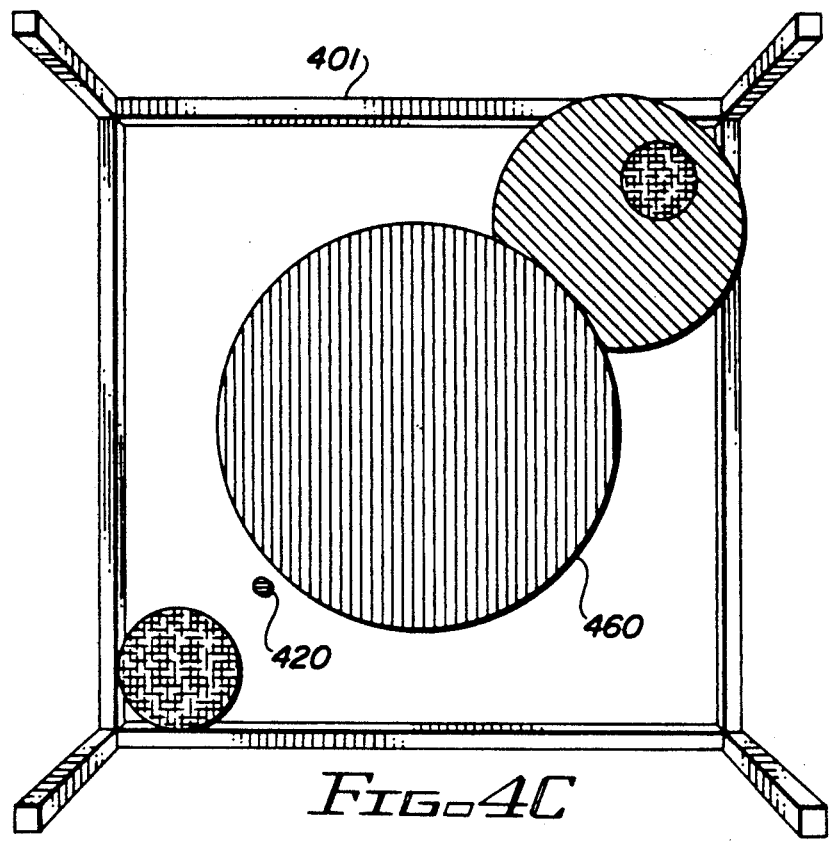
FIG. 4c depicts an all nets displays at Time (T) in accordance with the present invention.

The face or plane at time T is called all nets at a time T in the cube of all nets for all time as shown in FIG. 4b at label 450. Then, instead of drawing the full cube, the view from the right face can be drawn as the state of all nets at time T as shown in FIG. 4c. The size of all nets up to time (T) can be expanded to fill the graphic display, where the cube outline is kept in all figures to get visual reference 401.

The plane for all nets at time (T) provides a starting point to perform further analysis using conventional tools such as waveform display to analyze the specific subset of information. The key differentiating feature is that this technique provides the user with a display of the entire system. Based on the system display, the user can hone in on a problem area and quickly isolate the problem.

Figure 11:
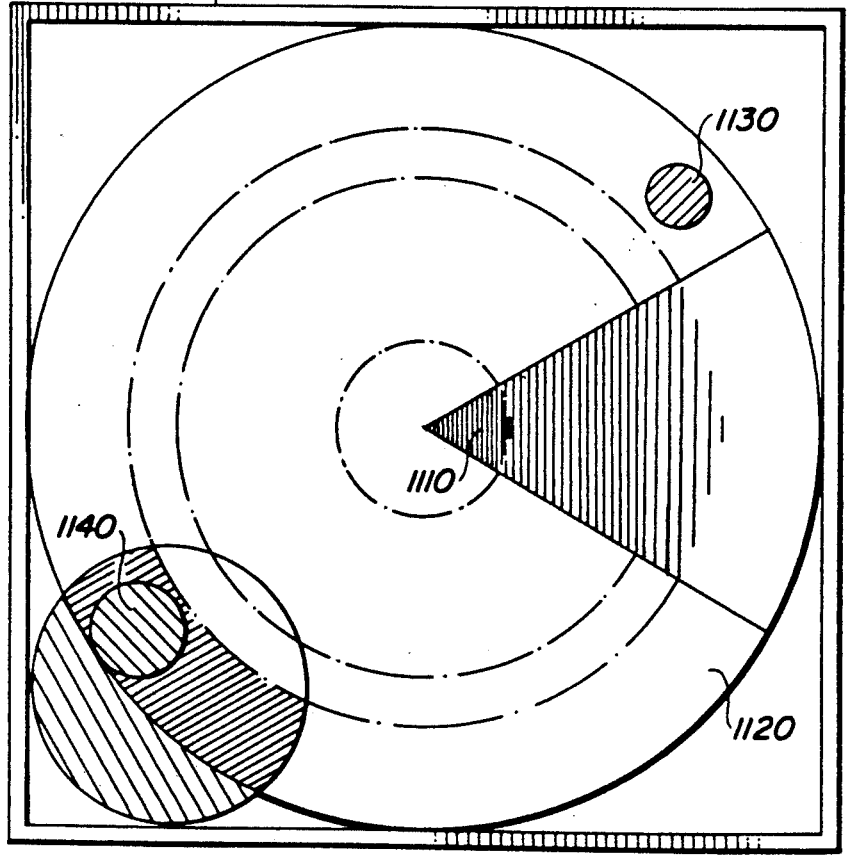
FIG. 11 is an all nets for all time changing in real time with color density and x, y relationship in accordance with the subject invention.

Now one can attempt to show how a user might visualize the series of all nets at overlayed incrementing times and result in a visual impression as shown in FIG. 11. For example, assume that the designer would like to explore the active or high power states and that one net starts the chain reaction as depicted by the tip of cone 460 in FIG. 4.

Looking at the successors of that net we can imagine the cone of successors 470 could all change to a high power state. Looking at the all nets display at any one time like T as shown in FIG. 4c, a circle 460 is displayed as a slice of 470.

If we flash each all nets at time t(n), as n increases in time, one after another or average them all together, the viewer visualization of the images would average the nets together where the center 460 would appear red 1110, but the outside rim would only appear red for a single time step 1120. Thus, the resulting image would have less color in the outer area due to a display of one-tenth duration. Further, the red color would increase in brightness as attention was focused on the center 1110. The hottest area of the circuit would convey clearly via the red area. The solid circles 1130 and 1140 represent nets that never change states.

For implementing the all net all time display, three-dimensional mapping software is used such as the support provided under Mathematica, which is described in "Mathematic, A System For Doing Mathematics By Computer", Stephen Wolfram, 1988, ISBN 0-201019334-5.

The logic for the all nets display is very similar to the logic used for the many net display. Lines are drawn in three-dimensional space instead of two-dimensional space, and the user selects a point of view to facilitate the correct perspective. One key to this process is selecting the proper color or non-color to facilitate views through the three-dimensional object. For example, if one is interested in the undefined or nets that never transition then they should be the only nets plotted to avoid cluttering the object. It may also be useful to pass transition data to a three dimensional surface shading routine and/or plot the 3D object as a stereographic image to help in the visualization process.

Figure 5:
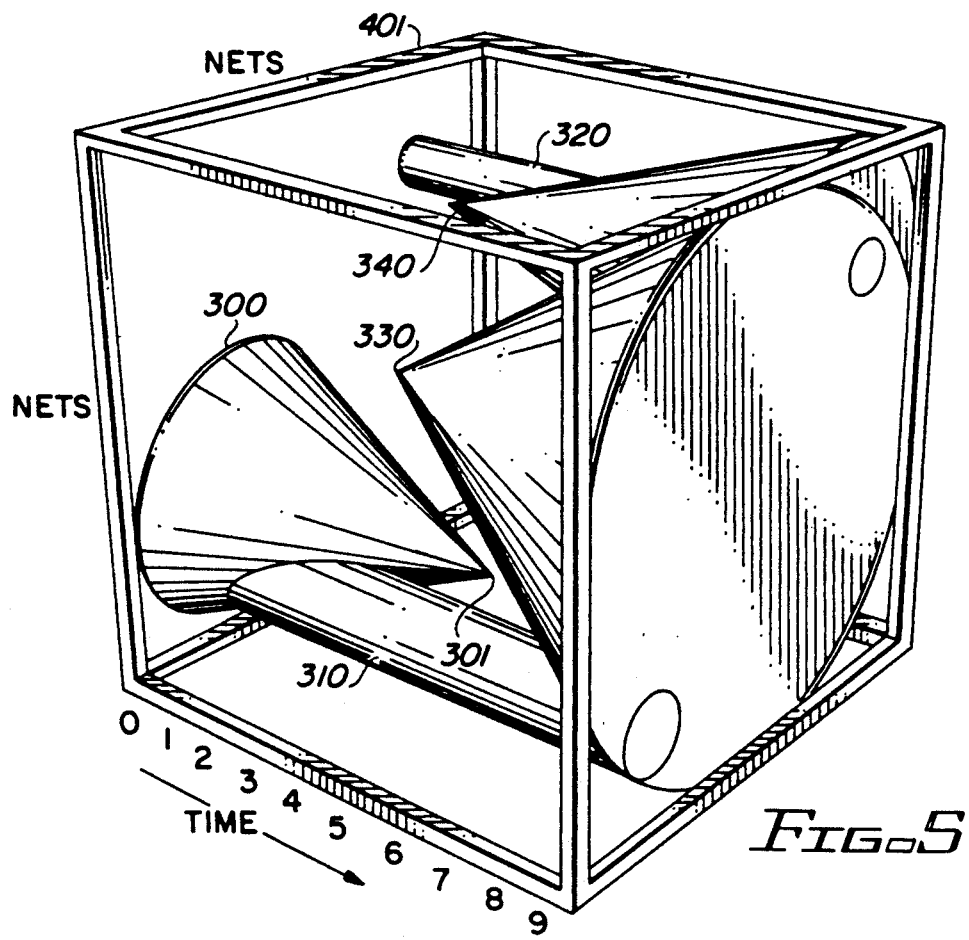
FIG. 5 illustrates a three-dimensional depiction of an all nets display in accordance with the present invention.

FIG. 5 displays only undefined states of nets and unchanging states of all nets. The nets that are undefined are represented by the cones labeled 300, 333 and 340. As time increases from left to right, the nets that were undefined become defined at the tip of the cone labeled 301. The cylinders 310 and 320 represent nets that never changed state, and the cones that increase in size from left to right 330 and 340 represent nets that are going undefined as time increases.

The invention can also identify power hot spots, lack of net activity, and circuit noise for a physical chip layout. All nets at time T graphically depict the function of interest, in this case power hot spots, over each of the networks of interest. The key to this analysis is creating a mapping of the physical chip to all nets space mapping that allows the designer to readily comprehend trouble spots on the chip.

For the analysis of net activity no more preprocessing is required, for net power or current the color mapping may be different. For example a 0 logic state might be a higher power state than a 1 logical state and thus select the color red for that specific circuit in the 0 state.

For delta current switching analysis the net transition times could be highlighted with color changes. Results can be displayed by commencing at time 0 and displaying each plane at increasing time steps. The rate of display changes is also adjustable to average the colors and get a global sense of the state of the machine. For example, if nets in a specific area are usually in the high power state, then the integrated color of that area might be red. The net states could be averaged automatically, or as the nets are drawn on the screen, but it is much better to allow a user to watch the display for exceptions and process the visual information dynamically.

The detailed logic associated with all nets processing is shown in FIG. 6. The logic is identical to the many nets display except for the additional loop for filling the three-dimensional area in function blocks 430 and 440. The nets are pre-ordered in function block 320 so that the (x,y) starting point of the net is a linear function of the primary driver circuit location (cx, cy) on the chip or board design. The initialization step also requires the user to select a perspective for viewing the three-dimensional display and decide if a static display is more effective or repetitive viewing of all nets at time t(n) as n increased in time.

If the later is required, then the time (t) function is representative of a small subset of time to display all nets at time t. Further, the X,Y,t starting point could be reset to zero to overlay all nets displays instead of spreading them out in 3D space. This facilitates dynamic processing of the net state averaging.

For an electrical circuit example, the all net display would perform the following steps.
1) Select the color, or intensity to represent each electrical state.
2) Select the states that require transparency.
3) Select the user viewport (X, Y, z) in three-dimensional space.
4) Decide on a maximum number of nets to display.
5) Allocate the nets by physical position and assign X, Y, 0 starting points.
6) Create a set of physical points if required.
7) Select a subset of points that will fit on the display.
8) Determine the time window of interest.
9) Decide on the time vs. spacial raster rate.
10) Calculate the number of time steps and delta T per time step
11) Do for each net data display result:
  a. Index to the next X, Y, 0 start point representing nets' starting point
  b. Reset net state offset counter or transition pointer
  c. Do for net transitions
    1) Increment net pointer to obtain next set of net simulation data
    2) Test for a transition in the net data and change color
    3) Plot the line segment value form the last transition in three-dimensional space
    4) Plot the volume if time compression or decompression in three-dimensional space
    5) Exit loop if data or time window limit is attained
  d. Enddo (net transition)
12. Enddo (net data)

A possible alternative enhancing the visualization uses a technique for displaying a set of line segments for each net. The display would consist of a polygon area that represents the net state at time T and the shape would represent all the physical points in a specific net on a chip, card or board. Then, a further enhancement provides time compression so that the all net at time T plane becomes all nets at times t(n) through t(m).

For example, let the shape of the area be a square. Further, let the square represent sixteen time steps, whereby time is rastered across the square displaying the sixteen time steps and forms a pattern of colors representing the time window. The resultant display of the chip simulation states correlates the E-beam voltage contrast image of the physical chip in operation with the refresh rate of the raster display.

Figure 7A:
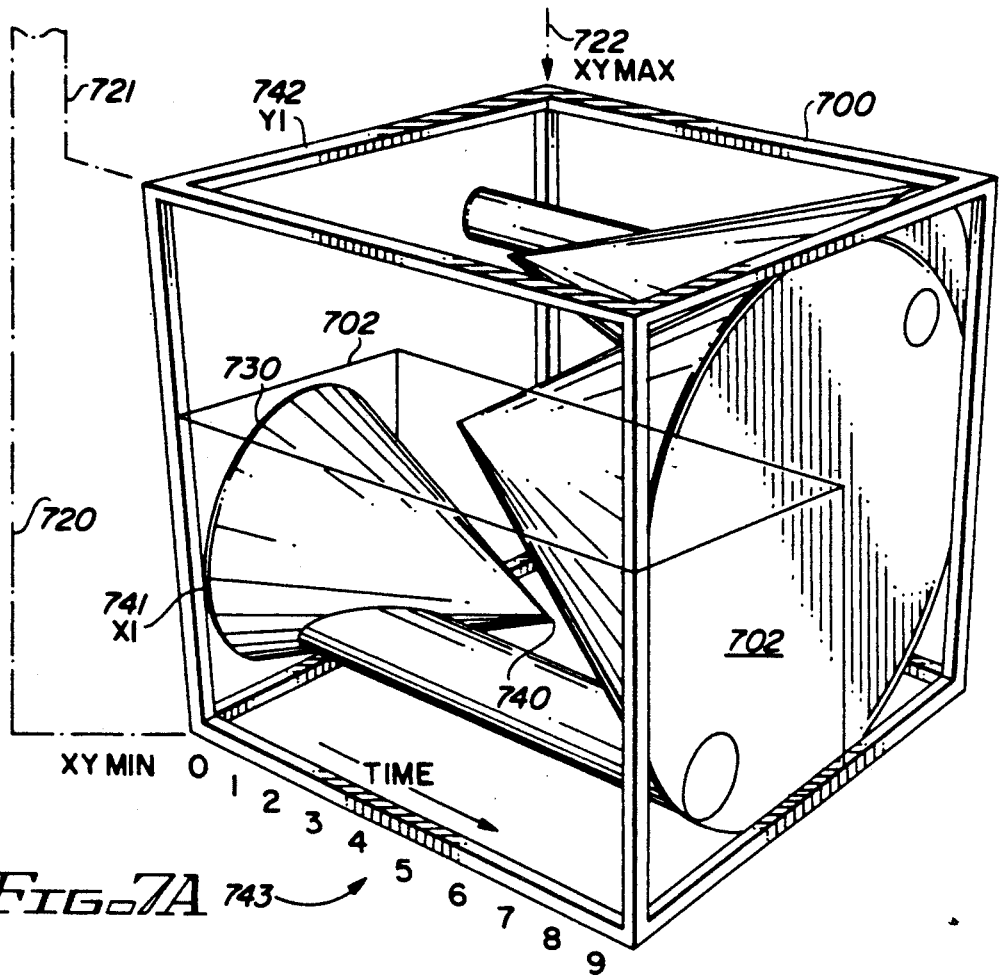
FIG. 7a is a circuit diagram of the physical design of a semiconductor.
Figure 7B:
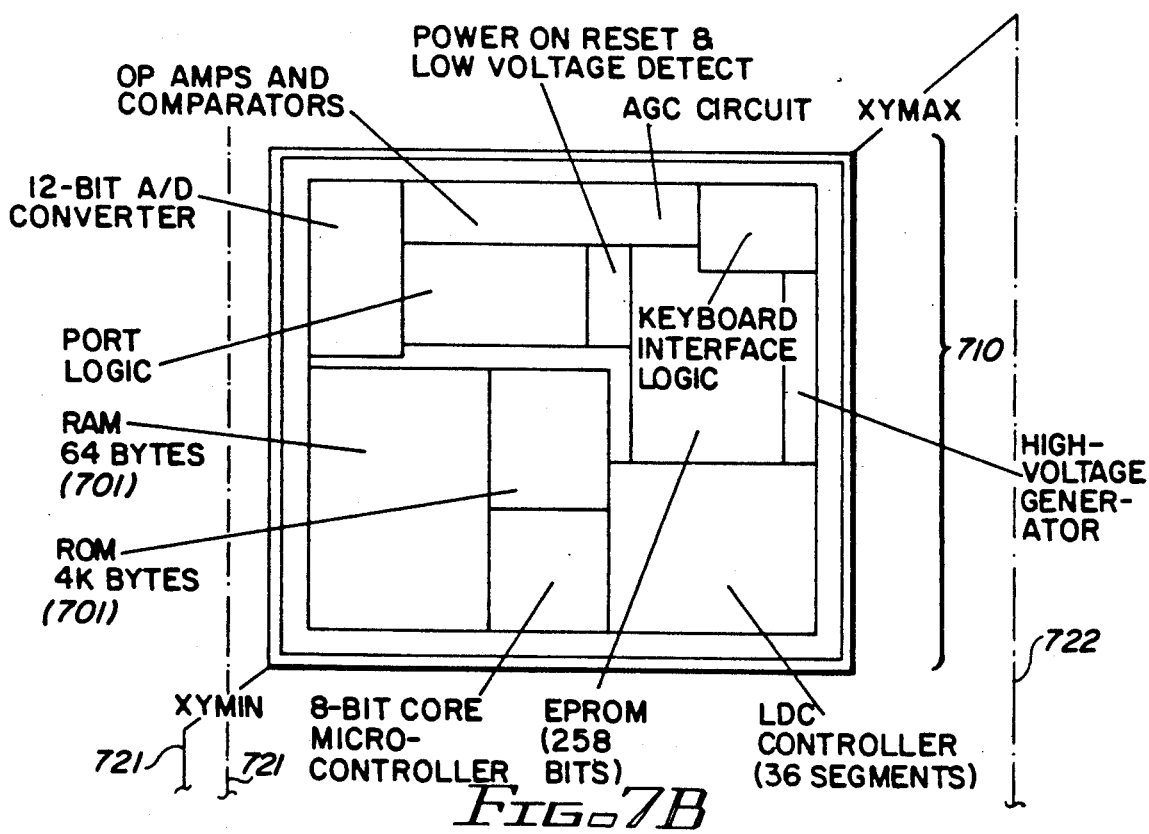
FIG. 7b is an all nets display of the semiconductor depicted in FIG. 7a in accordance with the present invention.

FIG. 7a shows a volume marked off by a boundary 700 containing a sub volume labeled 702. The physical chip design is shown in FIG. 7b labeled 710. The mapping from the x, y location of net drivers on the physical chip is indicated by 720, 721 and 722. It is clear that the nets located in the macro 701 are the only nets on the chip that commence in the undefined state 730 and become defined at some later time 740.

Given the x,y,z location of that point in the graphic net space volume 700 one can locate the x1 741, y1 742 point on the chip and thus the net that was the last net to get reset to a defined state. Further, the event clearly transpired at time 743.

Figure 8:
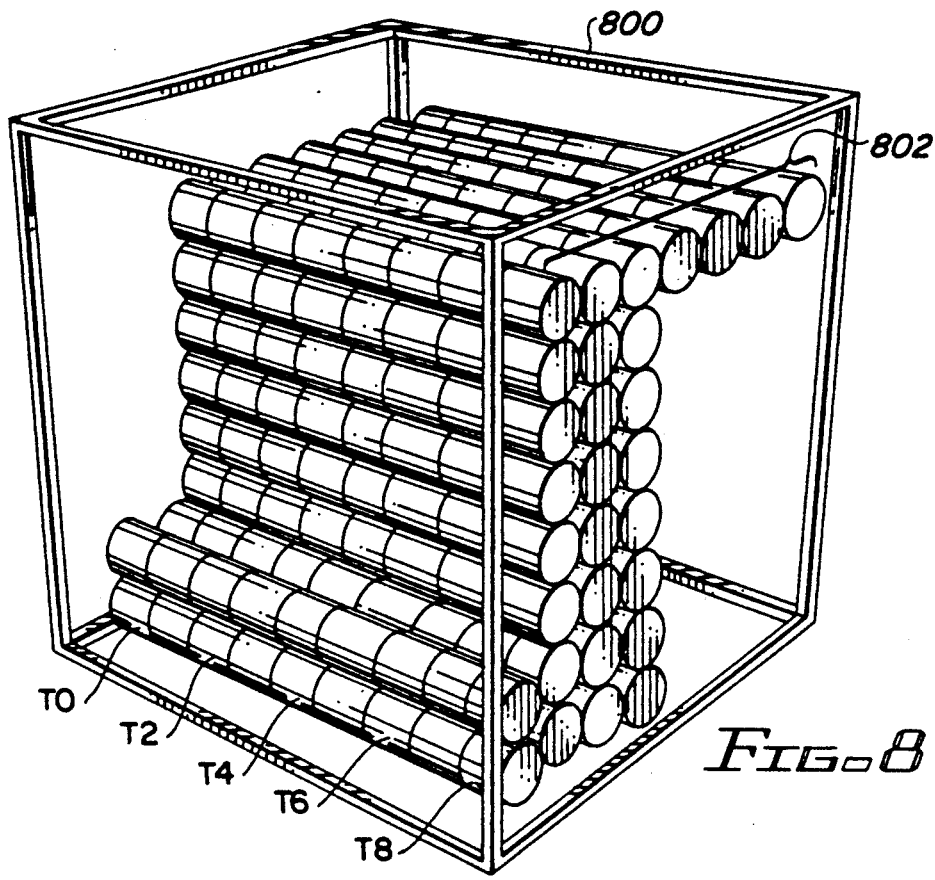
FIG. 8 is an all nets display of clock with space relationship in accordance with the present invention.
Figure 9:
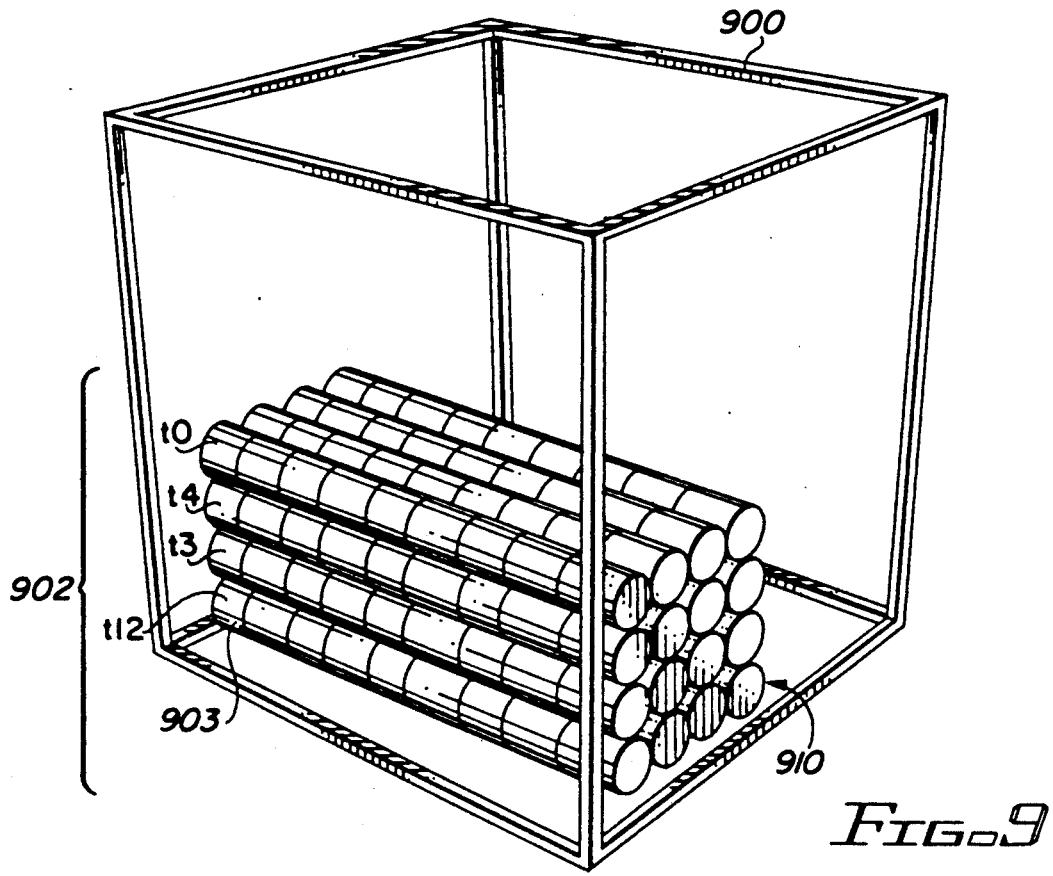
FIG. 9 is an all nets display of two features in accordance with the present invention.
Figure 10:
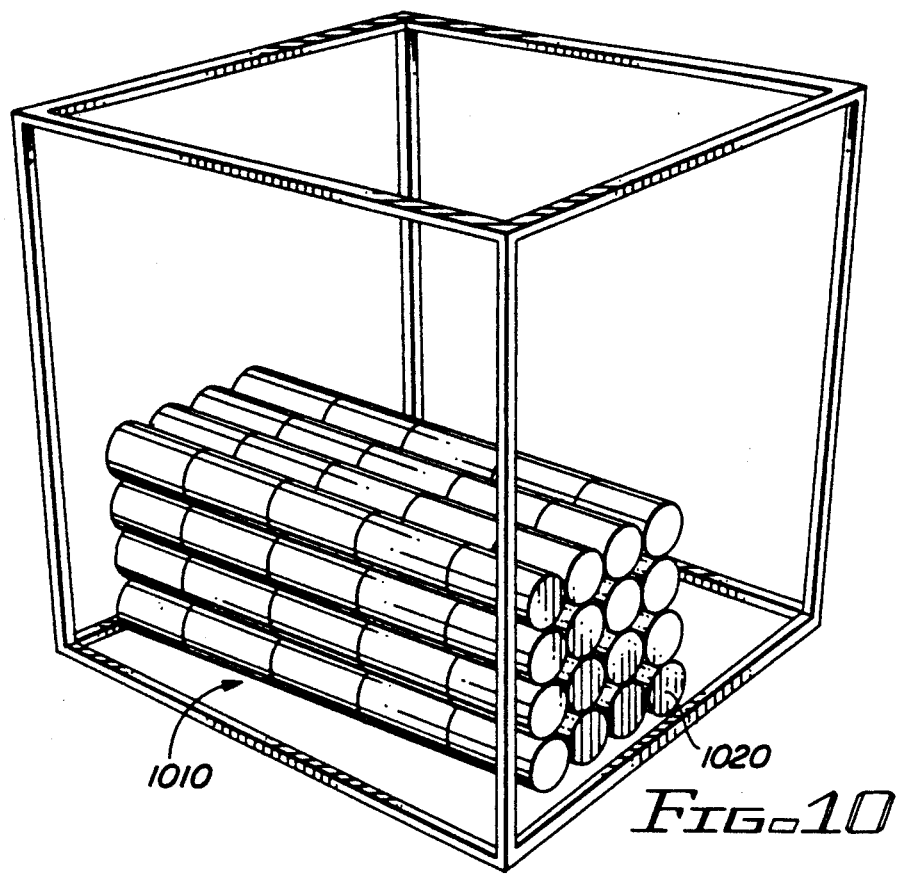
FIG. 10 is an all nets display of two features with a different selection of time space compression in accordance with the present invention.

The three shaded FIGS. 8, 9, and 10 show the net state lines as cylinders to emphasize the net and make it clearly differentiable. The single net shown is a clock waveform and this time the net is defined and oscillates for all time.

FIG. 8 shows an area marked off by a boundary 800 which is all net space. The volume contains a sub volume indicated by 802 representing a single net. The net is represented by sixteen cylinders with alternating white and black as the net changes its logical state in time. The shape selected matches the shape of a net on a chip (S shape). Time range from t0 to t8 in increments of one second. At time t8, the net is in the logic 0 state and is shown as all white.

Since the shape of the net display represents the shape of the physical design the user can see the entire physical expanse and logical state of the network. FIGS. 9 and 10 highlight another feature. The shape selected matches the shape of a net on a chip (square), and the clock rate of the net matches the selection of the depiction of time. By allowing user control of this compression or decompression of time into space display, the user can investigate patterns which helps the user to understand the way the system is functioning. In FIG. 9 instead of having the planes represent one time period as in FIG. 8 time can be compressed or envisioned as rastered across the image.

Again a volume marked off by a boundary 900 for all nets contains a sub volume indicated by 902 representative of a single net represented with sixteen pels. The raster of time is shown with the time label 903. The last time point is 910. A different selection of time space compression is used to generate FIG. 10. Notice how different it looks, and the different patterns from the side 1010 and end view 1020.

Detailed Logic

An embodiment of the invention developed by the inventor to analyze and debug VLSI chips is provided below to clarify the detailed logic of the present invention. The logic is presented via a Pascal source code listing currently employed by IBM.

```
CONST /* MULTI-DIMENSIONAL ANALYSIS DISPLAY CODE */
    ALVL = 2; (*   ACTIVE LEVEL COLOR *)
    ILVL = 4; (* NON-ACTIVE LEVEL COLOR *)
    ULVL = 1; (*  UNDEFINED LEVEL COLOR *)
    DLVL = 3; (*   DELAY LEVEL COLOR *)
(*
    0 = WHITE
    1 = RED
    2 = GREEN
    3 = YELLOW
    4 = BLUE
    5 = MAGENTA
    6 = CYAN
    7 = WHITE
*)
%page
(*****************************************************************)
(*                                          *)
(* ROUTINE NAME: PREP_NETS                  *)
(*                                          *)
(* ROUTINE TYPE: PROCEDURE                  *)
(*                                          *)
(* FUNCTION: THIS PROCEDURE INITIALIZES DISPLAY PARAMETERS IN THE *)

(*       EDIT RECORDS OF NETS IN THE VIEWED LIST.        *)
(*                                          *)
(* PARAMETERS:                              *)
(*   1) VCNT - NUMBER OF NETS TO PROCESS    *)
(*                                          *)
(* RETURNS: NONE                            *)
(*                                          *)
(*****************************************************************)
```

```
PROCEDURE PREP_NETS (CONST VCNT : INTEGER);

VAR
 I,R : INTEGER;
 LP : PEDIT_REC;

BEGIN                       (* begin PREP_NETS     *)
 LP := HEADPTR;
 FOR I := 1 TO VCNT DO       (* SCAN THE NET LIST   *)
  BEGIN
   REPEAT
    LP := LP->.CHAIN_FORWARD;
   UNTIL (NET_VIEW IN LP->.NET_FLAGS); (* UNTIL VIEWED NET *)
   SLOT(.I.) := LP;          (* SAVE NET POINTER    *)
   R := 1;

(****************************************************************)
(* GROUP REGISTERS TOGETHER FOR DISPLAY                         *)
(****************************************************************)

IF REG_DEF IN LP->.NET_FLAGS
    THEN BEGIN
     REPEAT                  (* SCAN FOR END OF REGISTER *)
      LP := LP->.CHAIN_FORWARD;
      R := R + 1;            (* INCREMENT REGISTER COUNT *)
     UNTIL REG_DEF IN LP->.NET_FLAGS;
     IF REG_REV IN LP->.NET_FLAGS  (* IF REVERSED REGISTER *)
      THEN SLOT(.I.) := LP;   (*  THEN UPDATE NET POINTER*)
     END;                    (* END IF THEN A REGISTER  *)
   WITH SLOT(.I.)-> DO
    BEGIN
     REGCNT := R;            (* SAVE REGISTER LENGTH   *)
     IF (LENGTH (NETNAME_PTR->.NAM) > DNAME_LENGTH) AND
        (NOT NM_LEN_SET)
      THEN DNAME_LENGTH := LENGTH (NETNAME_PTR->.NAM);
    END;
  END;
%PAGE
(****************************************************************)
(* INITALIZE DISPLAY PARAMETERS                                 *)
(****************************************************************)
 SLOT(.VCNT+1.) := TAILPTR;   (* FLAG END OF VIEW LIST  *)
 YINCW := 4;
 MAXWAVE := PLOT_HEIGHT DIV 4;
 IF DISPLAY_WAVE
  THEN PLOT_START := 2 * XCHARSIZE
  ELSE PLOT_START := (FUNCTION_LEN + DNAME_LENGTH + 8) *
XCHARSIZE;

PLOT_LENGTH := XMAX - PLOT_START;
 IF QPARM = 'D'
  THEN RETURN;
```

```
(*****************************************************)
(* INITALIZE WINDOW CONTENTS                         *)
(*****************************************************)
  WRITESTR (BUFFER.S,DNAME_LENGTH:-2);
  R := FSWRITEW (213,$REP,BUFFER);
  if CYCLE_MARK              (* if cycle marks on    *)
    then BUFFER.S := 'ON'     (* then set field on    *)
    else BUFFER.S := 'OFF';   (* else set field to off *)
  R := FSWRITEW (209,$REP,BUFFER);
  if VIEW_LEFT               (* if view first 32 chars *)
    then BUFFER.S := 'FIRST'  (* then set field first  *)
    else BUFFER.S := 'LAST';  (* else set field last   *)
  R := FSWRITEW (212,$REP,BUFFER);
  IF DISPLAY_WAVE
    then BUFFER.S := 'Drawing Waveforms ...'
    else BUFFER.S := 'Drawing Character Display ...';
  R := FSWRITEW (200,$REP,BUFFER);
  SET_WINDOWS ($ON);          (* TURN ON DISPLAY WINDOWS *)
END;                          (* end PREP_NETS            *)
%page
(*****************************************************)
(*                                                   *)
(* ROUTINE NAME: TIME                                *)
(*                                                   *)
(* ROUTINE TYPE: FUNCTION                            *)
(*                                                   *)
(* FUNCTION: THIS PROCEDURE WILL CALCULATE THE TIME DEPENDING ON *)
(*         THE DISPLAY/DATA MODE.                    *)
(*                                                   *)
(* PARAMETERS:                                       *)
(*   1) CYCLE - CYCLE NUMBER                         *)
(*   2) LEVEL - LEVEL NUMBER                         *)
(*                                                   *)
(* RETURNS:                                          *)
(*   1) CONVERTED TIME VALUE                         *)
(*                                                   *)
(*****************************************************)
FUNCTION TIME (CONST CYCLE,LEVEL : INTEGER) : INTEGER;    ENTRY;

(*****************************************************)
(* FIND THE TIME OF THE CURRENT CYCLE/LEVEL          *)
(*****************************************************)
BEGIN                         (* BEGIN TIME           *)
  IF MODE = $DEBUG            (* IF DEBUG MODE        *)
    THEN TIME := ((CYCLE - START_CYCLE) * LEVEL_CYCLE) +
         LEVEL - START_LEVEL
    ELSE TIME := CYCLE - START_CYCLE;  (* ELSE STROBE MODE *)
END;                          (* END TIME             *)
%page
(*****************************************************)
```

```
(*                                            *)
(* ROUTINE NAME: BACK_SCALE                   *)
(*                                            *)
(* ROUTINE TYPE: PROCEDURE                    *)
(*                                            *)
(* FUNCTION: THIS PROCEDURE WILL CALCULATE THE CYCLE AND LEVEL
*)
(*       NUMBERS FROM THE GIVEN TIME.         *)
(*                                            *)
(* PARAMETERS:                                *)
(*   1) T - TIME VALUE TO BE BACK-SCALED      *)
(*                                            *)
(* RETURNS:                                   *)
(*   1) CYCLE - CYCLE NUMBER                  *)
(*   2) LEVEL - LEVEL NUMBER                  *)
(*                                            *)
(************************************************************)
PROCEDURE BACK_SCALE (CONST   T : INTEGER;
             CONST FLDNM : FSFLDE;
             VAR   CYCLE : INTEGER;
             VAR   LEVEL : INTEGER);           ENTRY;

VAR
  R : INTEGER;

(************************************************************)
(* SCALE THE CURRENT TIME BACK TO CYCLE AND LEVEL NUMBERS   *)
(************************************************************)
BEGIN                      (* begin BACK_SCALE     *)
  IF MODE = $DEBUG         (* if debug mode        *)
    THEN BEGIN             (* then scale cycle/level *)
      R := T + START_LEVEL - 1;
      CYCLE := R DIV LEVEL_CYCLE + START_CYCLE;
      LEVEL := R MOD LEVEL_CYCLE + 1;
      END                  (* end if then          *)
    ELSE BEGIN             (* else strobe mode     *)
      CYCLE := T + START_CYCLE;
      LEVEL := STROBE_VALUE;

IF (FLDNM = 0) OR
    (QPARM = 'D')
    THEN RETURN;
  WRITESTR (BUFFER.S,CYCLE:-5);
  R := FSWRITEW (FLDNM,$REP,BUFFER);
  WRITESTR (BUFFER.S,LEVEL:-5);
  R := FSWRITEW (FLDNM+1,$REP,BUFFER);
END;                       (* end BACK_SCALE       *)
%page
(************************************************************)
(*                                            *)
(* ROUTINE NAME: READ_DATA                    *)
```

```
(*                                          *)
(* ROUTINE TYPE: FUNCTION                   *)
(*                                          *)
(* FUNCTION: THIS PROCEDURE WILL READ THE LSM DATA FOR A GIVEN *)
(*          TIME SLOT INTO AN ARRAY FOR QUICK REFERENCE.       *)
(*                                          *)
(* PARAMETERS:                              *)
(*  1) T - THE TIME NUMBER OF THE DATA REQUIRED.              *)
(*                                          *)
(* RETURNS: NONE                            *)
(*                                          *)
(*************************************************************)
PROCEDURE READ_DATA (CONST T : INTEGER);               ENTRY;

VAR
  I,RECNO   : INTEGER;
  HW_POINTER : INTEGER;

(*************************************************************)
(* CALCULATE THE RECORD AND WORD POINTER ....                *)
(*************************************************************)
BEGIN                        (* BEGIN READ_DATA        *)
  IF T = WAVE_TIME THEN RETURN;    (* IF RECORD IS CURRENT *)
  WAVE_TIME := T;                  (* SAVE THE TIME NUMBER *)
  HW_POINTER := ((T * DATA_SIZE) MOD 128) + 1;
  RECNO := ((T * DATA_SIZE) DIV 128) + 2;

IF RECNO ^= WAVE_RECNO           (* IF NEW RECORD NEEDED  *)
    THEN BEGIN                     (* THEN:                 *)
      WAVE_RECNO := RECNO;         (* SAVE NEW RECORD NUMBER *)
      SEEK (LSMDOUT,WAVE_RECNO);   (* SEEK TO GIVEN RECORD  *)
      GET (LSMDOUT);               (* READ THE RECORD       *)
    END;

(*************************************************************)
(* READ IN THE REQUIRED RECORD(S)                            *)
(*************************************************************)
  FOR I := 1 TO DATA_SIZE DO       (* READ THE LSM DATA     *)
    BEGIN
      WAVEFORM.RECDATA(.I.) := LSMDOUT->.RECDATA(.HW_POINTER.);
      HW_POINTER := HW_POINTER + 1;
      IF HW_POINTER > 128          (* IF NEXT RECORD REQUIRED *)
        THEN BEGIN                 (* THEN READ NEXT RECORD   *)
          HW_POINTER := 1;
          WAVE_RECNO := WAVE_RECNO + 1;
          GET (LSMDOUT);
        END;
    END;
END;                               (* END READ_DATA         *)
%page
(*************************************************************)
(*                                          *)
```

```
(* ROUTINE NAME: NETVALUE                                      *)
(*                                                             *)
(* ROUTINE TYPE: FUNCTION                                      *)
(*                                                             *)
(* FUNCTION: THIS PROCEDURE WILL FIND THE CURRENT NET'S VALUE. *)
(*                                                             *)
(* PARAMETERS:                                                 *)
(*   1) PTR  - POINTER TO EDITOR RECORD                        *)
(*                                                             *)
(* RETURNS:                                                    *)
(*   1) CHARACTER REPRESENTING VALUE OF NET AT CURRENT TIME    *)
(*                                                             *)
(*************************************************************)
function NETVALUE (const PTR : PEDIT_REC) : CHAR;        ENTRY;

VAR
  LSMW   : INTEGER;
  LSMBIT : INTEGER;

(*************************************************************)
(* FIND THE VALUE OF THE NET AT THE GIVEN TIME                *)
(*************************************************************)
begin                      (* BEGIN NETVALUE    *)
  IF (NET_GAP IN PTR->.NET_FLAGS)    (* IF GAP RECORD      *)
    THEN NETVALUE := ' '
    ELSE BEGIN
      LSMW := PTR->.IAX;
      LSMBIT := 14 - (2 * (LSMW MOD 8)); (* calculate bit shift    *)
      LSMW := (LSMW DIV 8) + 1;      (* calculate word index  *)
      LSMW := (WAVEFORM.RECDATA(.LSMW.) >> LSMBIT) AND '0003'X;
      IF ((LSMW AND '0001'X) ~= 0) OR   (* IF UNDEFINED OR     *)
         (PTR->.NETNAME_PTR->.NAM(.1.) ~= '-')  (* ACTIVE LEVEL PLUS *)
        THEN NETVALUE := LSMCHAR(.LSMW.)
        ELSE NETVALUE := LSMCHAR(.LSMW && 2.);
    END;
end;                       (* END NETVALUE      *)
%page
(*************************************************************)
(*                                                             *)
(* ROUTINE NAME: REGVALUE                                      *)
(*                                                             *)
(* ROUTINE TYPE: FUNCTION                                      *)
(*                                                             *)
(* FUNCTION: THIS PROCEDURE WILL FIND THE CURRENT NET'S VALUE AS *)

(*        EITHER A SINGLE NET OR AS A REGISTER.                *)
(*                                                             *)
(* PARAMETERS:                                                 *)
(*   1) PTR  - POINTER TO EDITOR RECORD                        *)
(*                                                             *)
(* RETURNS:                                                    *)
```

```
(*  1) STRING OF CHAR(S) REPRESENTING THE VALUE.         *)
(*                                                        *)
(**********************************************************)
  function REGVALUE (const PTR : PEDIT_REC) : STRING(255);     ENTRY;

TYPE
  HEXCHARS = ARRAY (.-1..15.) OF STRING(1);

CONST
  MINUS1  = -1;
  HEX     = HEXCHARS('*','0','1','2','3','4','5','6','7',
              '8','9','A','B','C','D','E','F');

VAR
  I,REG   : INTEGER;
  COUNT   : INTEGER;
  LP      : PEDIT_REC;
  TSTR    : STRING(255);
  NETCHAR : CHAR;

begin                    (* BEGIN REGVALUE         *)
(**********************************************************)
(* FIND VALUE OF A REGISTER AT THE GIVEN SLOT              *)
(**********************************************************)
  IF NOT (REG_DEF IN PTR->.NET_FLAGS)  (* IF NET IS SINGLE VALUE *)
    THEN REGVALUE := STR (NETVALUE (PTR))
    ELSE WITH PTR-> DO
      BEGIN
        TSTR := '';             (* CLEAR RESULT STRING    *)
        COUNT := REGCNT;
        LP := PTR;
        IF (ANLG_REG IN NET_FLAGS) OR   (* IF ANALOG REGISTER    *)
           (REG_TYP IN NET_FLAGS)       (*  OR A HEX REGISTER    *)
(**********************************************************)
(* FIND VALUE OF A HEX REGISTER                            *)
(**********************************************************)
          THEN BEGIN            (* THEN SCAN THE REGISTER *)
            WAVE_VAL := 0;
            IF NOT (REG_TYP IN NET_FLAGS) (* IF UNSIGNED REGISTER *)
              THEN BEGIN
                COUNT := COUNT - 1;  (* DON'T SCAN GAP RECORD *)
                IF (REG_REV IN NET_FLAGS) (* POINT TO 1ST DATA BIT *)
                  THEN LP := LP->.CHAIN_BACKWARD
                  ELSE LP := LP->.CHAIN_FORWARD;
              END;
            REPEAT              (* THEN SCAN THE REGISTER *)
              REG := 0;         (* START HEX DIGIT AS 0   *)
  WAVE_VAL := WAVE_VAL << 4;
  I := 1 << ((COUNT - 1) MOD 4); (* RELEVANT BIT OF DIGIT*)
  REPEAT                (* FORM HEX DIGIT         *)
    NETCHAR := NETVALUE (LP);
```

```
              IF NETCHAR = '1'
                THEN BEGIN
                  REG := REG | I;      (* VALUE WAS +           *)
                  WAVE_VAL := WAVE_VAL |·I;
                  END
                ELSE IF (NETCHAR ^= '0') AND
                       (NETCHAR ^= ' ')
                  THEN REG := -1;      (* VALUE WAS UNDEFINED   *)
              I := I >> 1;             (* POSITION FOR NEXT BIT *)
              IF (REG_REV IN NET_FLAGS) (* POINT TO NEXT LINE   *)
                THEN LP := LP->.CHAIN_BACKWARD
                ELSE LP := LP->.CHAIN_FORWARD;
              COUNT := COUNT - 1;
            UNTIL (I = 0);             (* UNTIL HEX DIGIT END   *)
            TSTR := TSTR || HEX(.REG.); (* ACCUMULATE HEX STRING *)
          UNTIL COUNT = 0;             (* UNTIL REGISTER END    *)
          IF (ANLG_REG IN NET_FLAGS) AND
             (REG_TYP IN NET_FLAGS) AND
             ((WAVE_VAL << (32 - REGCNT)) < 0)
            THEN WAVE_VAL := (MINUS1 << REGCNT) + WAVE_VAL;
          END (*****************************************************************)
(* FIND VALUE OF A BINARY REGISTER                              *)
(*****************************************************************)
        ELSE REPEAT              (* else scan binary reg    *)
          TSTR := TSTR || STR (NETVALUE (LP));
          IF (REG_REV IN LP->.NET_FLAGS) (* POINT TO NEXT LINE  *)
            THEN LP := LP->.CHAIN_BACKWARD
            ELSE LP := LP->.CHAIN_FORWARD;
          COUNT := COUNT - 1;
        UNTIL COUNT = 0;         (* UNTIL REGISTER END      *)
        REGVALUE := TSTR;
      END;
end;                    (* end REGVALUE        *)
%PAGE
(*****************************************************************)
(*                                      *)
(* ROUTINE NAME: SET_PLOT_LENGTH                       *)
(*                                      *)
(* ROUTINE TYPE: PROCEDURE                            *)
(*                                      *)
(* FUNCTION: THIS PROCEDURE WILL ESTABLISH THE DEFAULT PLOT    *)
(*        LENGTH SUCH THAT THE MINIMUM NUMBER OF (80% FULL)   *)
(*        SCREENS WILL BE DRAWN                       *)
(*                                      *)
(* PARAMETERS: NONE                            *)
(*                                      *)
(* RETURNS:                              *)
(*   1) DTWI - DEFAULT PLOT WIDTH FOR WAVEFORMS (GLOBAL VARIABLE)
*)
(*   2) DTCI - DEFAULT PLOT WIDTH FOR CHARACTERS (GLOBAL VARIABLE)
```

```
*)
(*                                                         *)
(*************************************************************)
procedure SET_PLOT_LENGTH;

VAR
  R,MIN_PLEN : INTEGER;         (* MIN. DEFAULT PLOT LENGTH *)

BEGIN                    (* BEGIN SET_PLOT_LENGTH   *)
  MIN_PLEN := (4 * PLOT_LENGTH) DIV 5;
  R := (MAX_TIME + PLOT_LENGTH - 1) DIV PLOT_LENGTH;
  REPEAT
   DTWI := (MAX_TIME + R - 1) DIV R;
   XINC := PLOT_LENGTH DIV DTWI;
   IF (XINC * DTWI) > MIN_PLEN
     THEN LEAVE;
   R := R + 1;
  UNTIL FALSE;

R := PLOT_LENGTH DIV XCHARSIZE;
  R := (MAX_TIME + R - 1) DIV R;
  REPEAT
   DTCI := (MAX_TIME + R - 1) DIV R;
   XINC := PLOT_LENGTH DIV DTCI;
   IF (XINC * DTCI) > MIN_PLEN
     THEN RETURN;
   R := R + 1;
   UNTIL FALSE;
END;                    (* END SET_PLOT_LENGTH   *)
%page
(*************************************************************)
(*                                                         *)
(* ROUTINE NAME: READ_LSM_HEADER                           *)
(*                                                         *)
(* ROUTINE TYPE: FUNCTION                                  *)
(*                                                         *)
(* FUNCTION: THIS PROCEDURE WILL READ THE HEADER OF THE LSM *)
(*        OUTPUT FILE AND SET VARIOUS GLOBAL VARIABLES.    *)
(*                                                         *)
(* PARAMETERS:                                             *)
(*  1. - THE USER'S TEST NAME                              *)
(*  2. - THE FILE MODE OF THE USER DISK                    *)
(*                                                         *)
(* RETURNS: NONE                                           *)
(*                                                         *)
(*************************************************************)
PROCEDURE READ_LSM_HEADER;                         ENTRY;

VAR
 R : INTEGER;

(*-----------------------------------------------------------*)
```

```
(* READ THE LSM DATA COLLECTION FILE AND BUILD INTERNAL WORK FILE
*)
(*----------------------------------------------------------------*)
BEGIN                        (* BEGIN READ_LSM_HEADER   *)
  DEFINE_OUTPUT_FILE;
  IF RCODE > 0 THEN RETURN;
  NEW_OUTPUT := TRUE;
  WAVE_RECNO := 1;           (* INITIAL RECORD NUMBER   *)
  WAVE_TIME := -1;           (* INITIALIZE ARRAY TIME   *)
  WITH LSMDOUT-> DO          (* MAKE RECORD ADDRESSABLE *)
   BEGIN                     (* EXTRACT DATA            *)
    LEVEL_CYCLE := HDLPCY;   (* GET LEVELS/CYCLE        *)
    START_CYCLE := HDBCYC;   (* GET START CYCLE         *)
    END_CYCLE := HDECYC;     (* GET END   CYCLE         *)
    START_LEVEL := HDBLVL;   (* GET START LEVEL         *)
    END_LEVEL := HDELVL;     (* GET END   LEVEL         *)
    NANOS_LEVEL := HDNPLV;   (* GET NANOSECONDS / LEVEL *)
    STROBE_VALUE := HDSLVL;  (* GET STROBE LEVEL        *)
    IF HDUND0 ^= CHR('00'X)  (* IF CHARACTER DEFINED    *)
      THEN LSMCHAR(.1.) := HDUND0   (*   THEN USE FOR DISPLAY  *)
      ELSE LSMCHAR(.1.) := '*';     (*   ELSE DEFAULT CHARACTER *)
    IF HDUND1 ^= CHR('00'X)  (* IF CHARACTER DEFINED    *)
      THEN LSMCHAR(.3.) := HDUND1   (*   THEN USE FOR DISPLAY  *)
      ELSE LSMCHAR(.3.) := '?';     (*   ELSE DEFAULT CHARACTER *)
    IF QPARM ^= 'D'
      THEN BEGIN
        BUFFER.S := STR (LSMCHAR(.1.));
        R := FSWRITEW (214,$REP,BUFFER);
        BUFFER.S := STR (LSMCHAR(.3.));
        R := FSWRITEW (215,$REP,BUFFER);
        END;
%PAGE
    TIME_BIAS := (START_CYCLE - 1) * LEVEL_CYCLE; (* BIAS FOR STB. *)
    CASE HDTYPE OF
        11 : IF MODE ^= $COMPARE
              THEN SUPERROR (90,NIL);
        12 : IF MODE ^= $STROBE
              THEN SUPERROR (90,NIL)
              ELSE BEGIN
                START_LEVEL := STROBE_VALUE;
                END_LEVEL := STROBE_VALUE;
                END;
        13 : IF MODE ^= $DEBUG
              THEN SUPERROR (90,NIL)
              ELSE BEGIN
                TIME_BIAS := TIME_BIAS + START_LEVEL - 1;
                IF QPARM ^= 'D'
                  THEN BEGIN
                    WRITESTR (BUFFER.S,'START LEVEL (',
                              START_LEVEL:5,') ==>');
                    R := FSWRITEW (219,$REP,BUFFER);
```

```
                WRITESTR (BUFFER.S,'END LEVEL (',
                         END_LEVEL:5,') ==>');
                R := FSWRITEW (221,$REP,BUFFER);
                END;
             END;

OTHERWISE SUPERROR (90,NIL);
       END;

IF HDWCNT = 0 THEN SUPERROR (92,NIL);
     IF RCODE > 0 THEN RETURN;
     IF MODE ^= $COMPARE
       THEN OUTPUT_EXISTS := TRUE;
     DATA_SIZE := (HDVCNT + 7) DIV 8;
     END;

IF QPARM ^= 'D'
    THEN BEGIN
      WRITESTR (BUFFER.S,'START CYCLE (',START_CYCLE:5,') ==>');
      R := FSWRITEW (218,$REP,BUFFER);
      WRITESTR (BUFFER.S,'END CYCLE (',END_CYCLE:5,') ==>');
      R := FSWRITEW (220,$REP,BUFFER);
      END;

IF NOT SPCNG_SET
    THEN BEGIN
      IF START_CYCLE = 1
        THEN MARK_START := 0
        ELSE MARK_START := START_CYCLE;
      IF QPARM ^= 'D'
        THEN BEGIN
          WRITESTR (BUFFER.S,MARK_START:-5);
          R := FSWRITEW (210,$REP,BUFFER);
          END;
      END;
  MAX_TIME := TIME (END_CYCLE,END_LEVEL); (* MAXIMUM DISPLAY TIME
 *)
END;                      (* END READ_LSM_HEADER    *)
%page
(*************************************************************)
(*                                    *)
(* ROUTINE NAME: SET_TIME_SCALE                 *)
(*                                    *)
(* ROUTINE TYPE: PROCEDURE                      *)
(*                                    *)
(* FUNCTION:  THIS PROCEDURE WILL ESTABLISH THE MAJOR INCREMENT
*)
(*        OF THE HORIZONTAL (TIME) AXIS OF THE 59FD DISPLAY.   *)
(*                                    *)
(* PARAMETERS:                          *)
(*   1) T1 - START TIME FOR WAVEFORM/CHARACTER DISPLAY       *)
```

```
(*  2) T2 - END  TIME FOR WAVEFORM/CHARACTER DISPLAY       *)
(*                                                          *)
(* RETURNS: GLOBAL PLOT PARAMETERS SET                      *)
(*                                                          *)
(************************************************************)
procedure SET_TIME_SCALE (CONST T1,T2 : INTEGER);

VAR
 R   : INTEGER;
 CSTR : STRING(5);

BEGIN                     (* BEGIN SET_TIME_SCALE   *)
 R := T2 - T1;
 IF (R ^= 0) AND
   (PLOT_LENGTH >= R)
  THEN BEGIN
   XINC := PLOT_LENGTH DIV R;
   WRITESTR (CSTR,END_CYCLE:-5);
   HSI := ((LENGTH(TRIM(CSTR))+1) * XCHARSIZE + XINC - 1) DIV XINC;
   IF MODE = $DEBUG         (* IF DEBUG MODE       *)
     THEN HSI := (HSI + LEVEL_CYCLE - 1) DIV LEVEL_CYCLE;
   IF NOT SPCNG_SET
     THEN BEGIN
      MARK_SPCNG := HSI;
      IF QPARM = 'D'
        THEN RETURN;
      WRITESTR (BUFFER.S,MARK_SPCNG:-5);
      R := FSWRITEW (211,$REP,BUFFER);
      END
     ELSE HSI := ((HSI + MARK_SPCNG-1) DIV MARK_SPCNG) * MARK_SPCNG;

END;

IF QPARM = 'D'
   THEN RETURN;
 WRITESTR (BUFFER.S,TOPX:-5);
 R := FSWRITEW (245,$REP,BUFFER);
  WRITESTR (BUFFER.S,SLOT(.TOPX.)->.NETNAME_PTR->.NAM:-32);
  R := FSWRITEW (246,$REP,BUFFER);
END;                      (* END SET_TIME_SCALE    *)
%page
(************************************************************)
(*                                                          *)
(* ROUTINE NAME: GENERATE_FLAGS                             *)
(*                                                          *)
(* ROUTINE TYPE: PROCEDURE                                  *)
(*                                                          *)
(* FUNCTION: THIS PROCEDURE GENERATES A STRING CONTAINING EDIT *)

(*        RECORD FLAG BIT INFORMATION (FAULT LIST, PREDECESSOR/ *)
(*        SUCCESSOR, AND PRIMARY I/O) FOR THE DISPLAY.      *)
(*                                                          *)
```

```
(* PARAMETERS: EDIT RECORD LINE POINTER                         *)
(*                                                              *)
(* RETURNS: STRING WITH FLAG BIT INFORMATION                    *)
(*                                                              *)
(****************************************************************)
procedure GENERATE_FLAGS (CONST LP : PEDIT_REC;
              VAR FSTR : STRING(5));         ENTRY;

BEGIN                       (* GENERATE_FLAGS       *)
  WITH LP-> DO
    BEGIN
      IF REG_DEF IN NET_FLAGS        (* IF NET IS A REGISTER  *)
        THEN IF ANLG_REG IN NET_FLAGS (* IF ANALOG REGISTER   *)
          THEN IF REG_TYP IN NET_FLAGS (* IF HEX REGISTER     *)
            THEN WRITESTR (FSTR,'SR',REGCNT:3)
            ELSE WRITESTR (FSTR,'UR',REGCNT-1:3)
          ELSE IF REG_TYP IN NET_FLAGS  (* IF HEX REGISTER    *)
            THEN WRITESTR (FSTR,'HR',REGCNT:3)
            ELSE WRITESTR (FSTR,'BR',REGCNT:3)
        ELSE BEGIN              (* ELSE DISPLAY NORMAL NET *)
          IF FLT_OUPT IN NET_FLAGS     (* IF FAULT LIST OUTPUT   *)
            THEN FSTR := 'FLO..'
            ELSE IF FLT_DEF IN NET_FLAGS (* IF FAULT LIST INPUT  *)
              THEN FSTR := 'FLI..'
              ELSE IF NET_PRED IN NET_FLAGS (* IF PREDECESSOR LINE *)
                THEN WRITESTR (FSTR,'P',NEST_INDEX:2,'..')
                ELSE IF NET_SUCC IN NET_FLAGS (* IF SUCCESSOR LINE *)
                  THEN WRITESTR (FSTR,'S',SNST_LEVEL:2,'..')
                  ELSE IF FUNNAME_PTR ^= NIL
                    THEN FSTR := '.....'
                    ELSE IF (LP = HEADPTR) OR
                         (LP = TAILPTR)
                      THEN FSTR := '*****'
                      ELSE FSTR := '    .';
          IF CMP_PI IN NET_FLAGS    (* CHECK FOR PI OR PO    *)
            THEN FSTR(.5.) := 'I'
            ELSE IF CMP_PO IN NET_FLAGS
              THEN FSTR(.5.) := 'O';
        END;
    END;
END;                        (* END GENERATE_FLAGS    *)
%PAGE
(****************************************************************)
(*                                                              *)
(* ROUTINE NAME: TRANSITION                                     *)
(*                                                              *)
(* ROUTINE TYPE: PROCEDURE                                      *)
(*                                                              *)
(* FUNCTION: THIS PROCEDURE DRAWS A WAVEFORM TRANSITION WITH AN *)
(*         APPROPRIATE DELAY INDICATION                         *)
(*                                                              *)
```

```
(* PARAMETERS:                                          *)
(*   1)  NP - POINTER TO EDITOR RECORD                  *)
(*   2)  NLVL - CURRENT WAVEFORM LEVEL                  *)
(*   3)  DLAY - NET DELAY VALUE                         *)
(*                                                      *)
(* RETURNS: NONE                                        *)
(*                                                      *)
(*******************************************************)
procedure TRANSITION (CONST  NP : PEDIT_REC;
            CONST NLVL : INTEGER;
            CONST DLAY : BYTE);

BEGIN                    (* BEGIN TRANSITION    *)
  WITH NP-> DO
    IF DATA_BASE AND
      (DLAY > 1)
     THEN IF (MODE = $DEBUG)
       THEN BEGIN
         GSLT (DLVL);         (* SHOW DELAY AS DOTTED LINE*)
         GSDRAW (LX-DLAY*XINC,LY);
         END;
END;                     (* END TRANSITION      *)
%PAGE
(*******************************************************)
(*                                                      *)
(* ROUTINE NAME: CHECK_CMPHIT                           *)
(*                                                      *)
(* ROUTINE TYPE: PROCEDURE                              *)
(*                                                      *)
(* FUNCTION: THIS PROCEDURE CHECKS TO SEE IF A COMPARE 'HIT'  *)
(*        OCCURRED ON THIS NET AND, IF SO, OVERLAYS A 'Q'    *)
(*        AT THE APPROPRIATE CYCLE/LEVEL ON THE DISPLAY.     *)
(*                                                      *)
(* PARAMETERS: EDIT RECORD LINE POINTER                 *)
(*                                                      *)
(* RETURNS: STRING WITH FLAG BIT INFORMATION            *)
(*                                                      *)
(*******************************************************)
procedure CHECK_CMPHIT (CONST T1,T2 : INTEGER);

VAR
  I,IX,T3 : INTEGER;
  CX,CY   : INTEGER;
  NP      : PEDIT_REC;

BEGIN                    (* BEGIN CHECK_CMPHIT  *)
  GSSL (3);              (* set character size  *)
  GSLT (ULVL);
  CY := YSTART;

FOR IX := TOPX TO BOTX-1 DO
```

```
    BEGIN
      NP := SLOT(.IX.);
      FOR I := 0 TO SLOT(.IX.)->.REGCNT - 1 DO
        WITH NP-> DO
          BEGIN
            IF (NOT DISPLAY_WAVE) AND
              (I ^= 0) AND
              ((NOT (ANLG_REG IN NET_FLAGS) AND
                NOT (REG_TYP IN NET_FLAGS)) OR
               ((I MOD 4) = 0))
              THEN CY := CY - YINC;
            IF CYCLE_NUMBER > 0       (* IF 'HIT' OCCURRED ON NET *)
              THEN BEGIN
                T3 := TIME (CYCLE_NUMBER,LEVEL_NUMBER);
                IF (T3 >= T1) AND
                   (T3 <= T2)         (* IF TIME ON DISPLAY      *)
                  THEN BEGIN
                    CX := PLOT_START - 4 + ((T3 - T1) * XINC);
                    GSCHAR (CX,CY,1,'Q');
                    END;
                END;
            IF REG_REV IN NET_FLAGS
              THEN NP := CHAIN_BACKWARD
              ELSE NP := CHAIN_FORWARD;
          END;
      CY := CY - YINC;
    END;
END;                    (* END CHECK_CMPHIT         *)
%PAGE
(*****************************************************************)
(*                                        *)
(* ROUTINE NAME: DRAWCHAR                         *)
(*                                        *)
(* ROUTINE TYPE: PROCEDURE                         *)
(*                                        *)
(* FUNCTION: THIS PROC DRAWS THE SELECTED NET CHARACTER DISPLAY
*)
(*                                        *)
(* PARAMETERS:                                *)
(*   1) T1 - START TIME FOR CHARACTER DISPLAY              *)
(*   2) T2 - END  TIME FOR CHARACTER DISPLAY              *)
(*                                        *)
(* RETURNS: NONE                              *)
(*                                        *)
(*****************************************************************)
procedure DRAWCHAR (CONST T1,T2 : INTEGER);
var
  I,J       : INTEGER;
  X,Y,YMID  : INTEGER;
  SlotIndex : INTEGER ;
  LP        : PEDIT_REC;
  NetStr    : STRING(MAXNET) ;
```

SHORT_REG : BOOLEAN;

(*****************************************************************)
(* DISPLAY THE NET VALUES FOR THE REQUESTED TIME RANGE           *)
(*****************************************************************)
```
begin                         (* BEGIN DRAWCHAR    *)
  PLOT_START := (FUNCTION_LEN + DNAME_LENGTH + 8) * XCHARSIZE;

PLOT_LENGTH := XMAX - PLOT_START;
  X := PLOT_START ;            (* START X FOR DISPLAY   *)
  GSLTD (4,5,5);               (* SET DOTTED LINE PARMS. *)

for J := T1 to T2 DO
   begin
    READ_DATA (J);
    for SlotIndex := TOPX TO BOTX-1 DO
      begin
        LP := SLOT(.SlotIndex.);   (* current line pointer   *)
        with LP-> do
          BEGIN
            IF (REG_DEF IN NET_FLAGS)
              THEN IF LR = 1
                THEN SHORT_REG := TRUE
                ELSE SHORT_REG := FALSE
              ELSE IF (NET_GAP IN NET_FLAGS) (* IF NOT DISPLAYABLE *)
                THEN CONTINUE
                ELSE SHORT_REG := FALSE;
            NETSTR := REGVALUE (LP);
            IF (ANLG_REG IN NET_FLAGS)
              THEN BEGIN
                I := ROUND (WAVE_VAL * WAVE_INC + Y_ZERO);
                IF (J ^= T1)
                  THEN BEGIN
                    GSLT (WAVE_N+1);  (* DRAW APPROP. LINE TYPE *)
                    GSMOVE (X-XINC,LW);
                    GSDRAW (  X, I);
                    END;
                LW := I;
                END
              ELSE IF NETSTR ^= LASTNETSTR(.SLOTINDEX.)
                THEN BEGIN
                  IF (X ^= (LX - XCHARSIZ + XINC)) AND
                     (NOT SHORT_REG)
                    THEN BEGIN
                      (**DASH DISPLAY**)
                      GSLT (4);    (* CONNECT *----*    *)
                      YMID := LY + YCHAR78 - YCHAR12 * LR;
                      GSMOVE (LX,YMID);
                      GSDRAW ( X,YMID);
                      END;
                    (****CHAR DISPLAY****)
```

```
            Y := LY;
            FOR I := 1 TO LR DO
              BEGIN
                IF (NETSTR(.I.) = '*')
                  THEN GSLT (1)
                  ELSE GSLT (0);
                GSCHAR (X,Y,1,NETSTR(.I.));
                Y := Y - YINC;
              END;
            LX := X + XCHARSIZ;
            LASTNETSTR(.SLOTINDEX.) := NETSTR;
            END             (* END IF VALUE CHANGED   *)
          ELSE IF (J = T2) AND
              (NOT SHORT_REG)
            THEN BEGIN
              (**DASH DISPLAY**)
              GSLT (4);       (* CONNECT *----*       *)
              YMID := LY + YCHAR78 - YCHAR12 * LR;
              GSMOVE (LX      ,YMID);
              GSDRAW ( X+XCHARSIZ,YMID);
              END;
      END;                 (* END WITH LP->       *)
    end;                   (* END FOR SlotIndex ...  *)
  X := X + XINC;
    end;                   (* END FOR J ...     *)
  GSLTD (4,0,0);            (* SET SOLID LINE MODE.  *)
end;                       (* end DRAWCHAR       *)
%page
(*******************************************************************)
(*                                                  *)
(* ROUTINE NAME: DRAWWAVE                           *)
(*                                                  *)
(* ROUTINE TYPE: PROCEDURE                          *)
(*                                                  *)
(* FUNCTION: THIS PROCEDURE WILL DRAW THE SELECTED NET
WAVEFORMS. *)
(*                                                  *)
(* PARAMETERS:                                      *)
(*  1) T1 - START TIME FOR WAVEFORM DISPLAY           *)
(*  2) T2 - END   TIME FOR WAVEFORM DISPLAY           *)
(*                                                  *)
(* RETURNS: NONE                                    *)
(*                                                  *)
(*******************************************************************)
procedure DRAWWAVE (const T1,T2 : INTEGER);

var
  I,J,X     : INTEGER;
  SI,COUNT,CN : INTEGER;
  LSMW,LSMB  : INTEGER;
  LP        : PEDIT_REC;
```

```
   CR         : SIGNED_UNIT;
   NetStr     : STRING(MAXNET) ;
   ACTV_LVL   : BOOLEAN;

(*****************************************************************)
(* DISPLAY THE NET VALUES FOR THE REQUESTED TIME RANGE           *)
(*****************************************************************)
BEGIN                       (* begin DRAWWAVE         *)
 PLOT_START := 2 * XCHARSIZE;
 PLOT_LENGTH := XMAX - PLOT_START;
 GSLTD (4,5,5);             (* SET DOTTED LINE MODE.  *)
 X := PLOT_START;           (* START X FOR WAVEFORMS  *)
 FOR J := T1 TO T2+1 DO
   BEGIN
    IF J <= T2
      THEN READ_DATA (J)
      ELSE X := X - XINC + XCHARSIZ;
    MINUS := YSTART;
    FOR SI := TOPX TO BOTX-1 DO
      BEGIN
        LP := SLOT(.SI.);        (* current line pointer   *)
        IF (ANLG_REG IN LP->.NET_FLAGS)
          THEN WITH LP-> DO
            BEGIN
              NETSTR := REGVALUE (LP);
              I := ROUND (WAVE_VAL * WAVE_INC + Y_ZERO);
              IF (J ^= T1)
                THEN BEGIN
                  GSLT (WAVE_N);    (* DRAW APPROP. LINE TYPE *)
                  GSMOVE (X-XINC,LW);
                  GSDRAW (   X, I);
                  END;
              LW := I;
              CONTINUE;
            END;
%PAGE
          COUNT := LP->.REGCNT;       (* then get register count *)
          FOR I := 1 TO COUNT DO
            WITH LP-> DO
              BEGIN
                IF NOT (NET_GAP IN NET_FLAGS) (* IF DISPLAYABLE NET *)
                  THEN BEGIN
                    IF J > T2         (* IF LAST DISPLAY        *)
                      THEN CR := 4    (* SET LAST PASS INDICATOR *)
                      ELSE BEGIN
                        CN := IAX << 1;
                        LSMW := (CN >> 4) + 1;  (* (IAX DIV 8) + 1 *)
                        LSMB := '000E'X && CN & '000E'X;
                        CR := (WAVEFORM.RECDATA(.LSMW.) >> LSMB)
                                        AND '0003'X;
                        END;
```

```
(*************************************************************)
(* DECISION BASED ON LAST VALUE OF THE GIVEN NET ....      *)
(*************************************************************)
              IF CR ^= LR       (* LAST VAL ^= CURRENT VAL *)
                THEN BEGIN      (* THEN DRAW LINE          *)
                  CASE LR OF
                    4 : BEGIN
                        LX := X; (* SAVE CURRENT X VALUE *)
                        LY := MINUS;
                      END;       (* END CASE LR = 4       *)

(*************************************************************)
(* DECISION BASED ON LAST VALUE OF THE GIVEN NET .... (CON'T)  *)
(*************************************************************)
                    0,2 : BEGIN    (* LAST VAL = 0 (-) OR 2 (+)*)
                        ACTV_LVL := ((LR = 2) &&
                            (NETNAME_PTR->.NAM(.1.) = '-'));
                        IF ACTV_LVL
                          THEN GSLT (ALVL) (* ACTIVE LEVEL *)
                          ELSE GSLT (ILVL);
                        GSMOVE (LX,LY); (*FRM LST TIME SLOT*)
                        GSDRAW ( X,LY); (* TO NEW TIME SLOT*)
                        LX := X;   (* SAVE CURRENT X VALUE *)
                        CASE CR OF  (* CASE CURRENT RESULT *)
                          0 : TRANSITION (LP,MINUS,FTIME);
                          2 : TRANSITION (LP,MINUS,RTIME);
                          OTHERWISE (* OTHERWISE ...    *)
                        END;       (* END CASE CR         *)
                      END;         (* END CASE LR = 0 OR 2 *)

(*************************************************************)
(* DECISION BASED ON LAST VALUE OF THE GIVEN NET .... (CON'T)  *)
(*************************************************************)
                    1,3 : BEGIN      (* LAST VAL = '*' OR '?'*)
                        GSLT (ULVL);
                        GSMOVE (LX,LY);
                        GSDRAW (X ,LY);
                        LX := X;
                      END;       (* END CASE LR = 1 OR 3  *)
                    OTHERWISE    (* OTHERWISE ...         *)
                  END;           (* END CASE LAST RESULT  *)
                  LR := CR;      (* SAVE CURRENT RESULT   *)
                END;             (* END IF SAME AS LAST   *)
            END;                 (* END IF NOT NET GAP    *)
          IF REG_REV IN NET_FLAGS (* IF A REVERSE REGISTER *)
            THEN LP := CHAIN_BACKWARD
            ELSE LP := CHAIN_FORWARD;
        END;                     (* end for I with LP     *)
      MINUS := MINUS - YINC;
    END;                         (* END FOR SI ...        *)
    X := X + XINC
```

```
    END;                    (* END FOR J ...       *)
  GSLTD (4,0,0);            (* SET SOLID LINE MODE.  *)
end;                        (* end DRAWWAVE        *)
%page
(*******************************************************************)
(*                                                                 *)
(* ROUTINE NAME: DRAW_OUTPUT                                       *)
(*                                                                 *)
(* ROUTINE TYPE: PROCEDURE                                         *)
(*                                                                 *)
(* FUNCTION: THIS PROCEDURE WILL DISPLAY THE INFORMATION           *)
(*           PERTINENT TO A SINGLE NET, AND DRAW THE DISPLAY       *)
(*           TIMING SCALE AND THE USER TEST INFORMATION.           *)
(*                                                                 *)
(* PARAMETERS:                                                     *)
(*   1) T1 - START TIME FOR WAVEFORM/CHARACTER DISPLAY             *)
(*   2) T2 - END   TIME FOR WAVEFORM/CHARACTER DISPLAY             *)
(*                                                                 *)
(* RETURNS: NONE                                                   *)
(*                                                                 *)
(*******************************************************************)
PROCEDURE DRAW_OUTPUT (CONST T1,T2 : INTEGER); ENTRY;

LABEL
  NODRAW;

VAR
  MAX_REG    : REAL;
  MAX_REGP   : REAL;
  MAX_REGN   : REAL;
  WAVE_RANGE : REAL;
  I,J,K,L,LS : INTEGER;
  X,Y        : INTEGER;
  N_WAVE     : INTEGER;

TL,TH,CN   : INTEGER;
  MARK_MOD   : INTEGER;         (* DISPLAY MARKS MODULUS  *)
  MARK1,MARK2 : INTEGER;
  DSP_HEIGHT : INTEGER;
  WYINC      : INTEGER;
  NP,LP      : PEDIT_REC;
  DATE,TOD   : ALFA;            (* CURRENT DATE/TIME      *)
  NAME_STR   : STRING (62);
  FLAG_STR   : STRING (5);
  FNAME      : STRING (32);
  DISP_STR   : STRING (108);
%PAGE
(*******************************************************************)
(* DISPLAY THE NET NAMES OF THE DISPLAYABLE NETS ...               *)
(*   LEAVING BOTX POINTING TO THE NEXT LINE TO DISPLAY,            *)
(*   ALLOWING FORWARD SCROLLING .                                  *)
(*******************************************************************)
```

```
BEGIN                     (* BEGIN DRAW_OUTPUT    *)
 DSP_HEIGHT := 0;
 IF DISPLAY_WAVE
   THEN BEGIN
     BACK_SCALE (T1,201,WAVE_STCYC,WAVE_STLEV);
     BACK_SCALE (T2,205,WAVE_ENCYC,WAVE_ENLEV);
     YINC := YINCW;
     YSIZE := 0;
     END
   ELSE BEGIN
     BACK_SCALE (T1,203,CHAR_STCYC,CHAR_STLEV);
     BACK_SCALE (T2,207,CHAR_ENCYC,CHAR_ENLEV);
     YINC := YCHARSIZE;         (* NET NAME SEPARATION   *)
     YSIZE := YCHARSIZ;         (* CHARACTER HEIGHT      *)
     END;

YSTART := YMAX_DIMEN - YINC;     (* START AT TOP AND GO DOWN *)
 HYSIZE := YSIZE DIV 2;
 SET_TIME_SCALE (T1,T2);
 IF QPARM ^= 'D'
   THEN BEGIN
     I := FSMODW (200,$OUT,$HIGH,$ON);
     I := FSDISPLAY ($NOWAIT,$NOALARM);
     END;

GSERSE;
 GSLT (0);
 IF NOT CSET_LOADED
   THEN BEGIN
     GSLPG ('GAAPAP ');          (* LOAD CHAR STROKE TABLE  *)
     GSLIM (250000,0);
     END;

GSVECM (15,BOX(.1,0.));         (* DRAW BOX AROUND TEST INFO*)
 GSSL (2);                       (* SET CHARACTER SIZE      *)
 NAMES_BOT := 0;
 BOTX := TOPX;
 N_WAVE := 0;
 MAX_REGP := 0;
 MAX_REGN := 0;
 Y := YSTART;
 L := PLOT_START + (T2 - T1) * XINC + XCHARSIZ;
%PAGE
 REPEAT
   NP := SLOT(.BOTX.);
   IF NP = TAILPTR THEN LEAVE;
   WITH NP-> DO              (* make record addressable *)
     BEGIN                   (* build DISPLAY NAME LINE *)
       J := DSP_HEIGHT;
       IF DISPLAY_WAVE
         THEN BEGIN
```

```
      IF (ANLG_REG IN NET_FLAGS)
        THEN BEGIN
          WYINC := YCHARSIZE;
          IF (N_WAVE = 0)
            THEN BEGIN
              J := J + MIN_ANLG_HT + YINCW - YCHARSIZE;
              Y := Y - YCHARSIZE;
              END;
            END
          ELSE IF (N_WAVE = 0)
            THEN WYINC := YINCW
            ELSE IF (REG_DEF IN NET_FLAGS) OR
                  (NOT (NET_GAP IN NET_FLAGS))
              THEN LEAVE
              ELSE WYINC := YCHARSIZE;
        J := J + WYINC;
        END
      ELSE BEGIN
        LX := PLOT_START + XCHARSIZ - XINC;  (* TO AVOID T1 TEST *)
        LASTNETSTR(.BOTX.) := CHAR('FF'X);
        IF (ANLG_REG IN NET_FLAGS)
          THEN BEGIN
            LR := 1;
            IF (N_WAVE = 0)
              THEN BEGIN
                J := J + MIN_ANLG_HT;
                Y := Y - YCHARSIZE;
                END;
              END
            ELSE IF (N_WAVE = 0)
              THEN BEGIN
                IF (REG_TYP IN NET_FLAGS)
                  THEN LR := (REGCNT + 3) DIV 4
                  ELSE LR := REGCNT;
                IF LR > MAXNET
                  THEN BEGIN
                    SUPERROR (31,NIL);
                    GOTO NODRAW;
                    END;
                END
              ELSE IF (REG_DEF IN NET_FLAGS) OR
                  NOT (NET_GAP IN NET_FLAGS)
                THEN LEAVE
                ELSE LR := 1;
        J := J + LR * YCHARSIZE;
        END;
%PAGE
      IF (J > PLOT_HEIGHT)
        THEN LEAVE;
      DSP_HEIGHT := J;
      IF (ANLG_REG IN NET_FLAGS)
```

```
      THEN BEGIN
        IF (REGCNT < 3)
          THEN MAX_REG := REGCNT
          ELSE BEGIN
            I := 1 << (REGCNT - 3) ;
            MAX_REG := REAL(I) * 4.0;
            END;
        IF (REG_TYP IN NET_FLAGS) AND
           (MAX_REG > MAX_REGN)
          THEN MAX_REGN := MAX_REG;
        IF (MAX_REG > MAX_REGP)
          THEN MAX_REGP := MAX_REG;
        WAVE_N := N_WAVE;
        N_WAVE := N_WAVE + 1;
        END;

IF DNAME_LENGTH > 0
     THEN BEGIN
       NAME_STR := NETNAME_PTR->.NAM;
       J := DNAME_LENGTH - LENGTH (NAME_STR);
       IF J < 0            (* IF TRUNCATION NEEDED   *)
         THEN BEGIN
           IF VIEW_LEFT
             THEN J := 1
             ELSE J := 1 - J;
           NAME_STR := SUBSTR (NAME_STR,J,DNAME_LENGTH);
           END
         ELSE IF J > 0
           THEN IF (NET_GAP IN NET_FLAGS)
             THEN NAME_STR := NAME_STR || SUBSTR (BLANKS,1,J)
             ELSE NAME_STR := NAME_STR||SUBSTR(NAME_TAIL,1,J);
       END
     ELSE NAME_STR := '';

GENERATE_FLAGS (NP,FLAG_STR);
%PAGE
(*****************************************************************)
(* ALSO DISPLAY THE FUNCTION IF ALLOWED ....              *)
(*****************************************************************)
     IF (FUNCTION_LEN = 0) OR
        (FUNNAME_PTR = NIL)
       THEN FNAME := ''
       ELSE BEGIN
         J := LENGTH(FUNNAME_PTR->) - 1;
         FNAME := SUBSTR (FUNNAME_PTR->,1,MIN(J,FUNCTION_LEN));
         J := FUNCTION_LEN - LENGTH (FNAME);
         IF J > 0          (* IF NAME TAIL IS NEEDED   *)
           THEN IF (NET_GAP IN NET_FLAGS)
             THEN FNAME := FNAME || SUBSTR (BLANKS,1,J)
             ELSE FNAME := FNAME || SUBSTR (NAME_TAIL,1,J);
         END;
```

```
         IF (ANLG_REG IN NET_FLAGS)
           THEN BEGIN                  (* THeN ANALOG REGISTER     *)
             GSLT (WAVE_N+1);          (* DRAW APPROP. LINE TYPE   *)
             GSMOVE (PLOT_START        ,Y + YCHAR_D2);
             GSDRAW (PLOT_START + 13*XCHARSIZE,Y + YCHAR_D2);
             GSLT (0);
             END;                      (* END ANALOG REGISTER      *)

IF DISPLAY_WAVE
           THEN BEGIN
             IF (NOT (ANLG_REG IN NET_FLAGS)) AND
                ((REG_DEF IN NET_FLAGS) OR
                 (NOT (NET_GAP IN NET_FLAGS)))
               THEN BEGIN
                 NAMES_BOT := Y;
                 LR := 4;              (* RESET VALUE FOR WAVES    *)
                 IF (REG_DEF IN NET_FLAGS) THEN
                   REPEAT              (* SCAN FOR END OF REGISTER *)
                     IF (REG_REV IN NP->.NET_FLAGS)
                       THEN NP := NP->.CHAIN_BACKWARD
                       ELSE NP := NP->.CHAIN_FORWARD;
                     NP->.LR := 4;     (* RESET VALUE FOR DISPLAY  *)
                   UNTIL (REG_DEF IN NP->.NET_FLAGS);
                 END;
             Y := Y - WYINC;
             END
           ELSE BEGIN                  (* ELSE CHARACTER DISPLAY   *)
             WRITESTR (DISP_STR,NAME_STR,' ',FLAG_STR:-6,FNAME);
             GSCHAR (0,Y,LENGTH (DISP_STR),DISP_STR(.1.));
             LY := Y;
             Y := Y - LR * YINC;
             IF (NOT (ANLG_REG IN NET_FLAGS)) AND
                ((REG_DEF IN NET_FLAGS) OR
                 (NOT (NET_GAP IN NET_FLAGS)))
               THEN BEGIN
                 NAMES_BOT := Y + YCHARSIZ;
                 IF (REG_DEF IN NET_FLAGS) (* IF NET IS A REG.      *)
                   THEN BEGIN          (* ELSE HEX REGISTER        *)
                     GSMOVE (PLOT_START,LY + YCHAR78);
                     GSDRAW (L         ,LY + YCHAR78);
                     GSMOVE (PLOT_START,NAMES_BOT);
                     GSDRAW (L         ,NAMES_BOT);
                     END;              (* END NET IS A REGISTER    *)
                 END;                  (* END NET NOT GAP RECORD   *)
             END;                      (* END ELSE CHAR. DISPLAY   *)
           END;                        (* END WITH NP-> DO         *)
         BOTX := BOTX + 1;             (* INCR LAST SLOT INDEX     *)
       UNTIL FALSE;
%PAGE
    IF (N_WAVE = 0)
      THEN SPLIT_TICK := FALSE;
    NAMES_CHANGE := FALSE;             (* RESET NAMES CHANGED FLAG *)
```

```
IF (N_WAVE ^= 0)
  THEN BEGIN
    IF (NAMES_BOT ^= 0)
      THEN SPLIT_TICK := CYCLE_MARK;
    IF SPLIT_TICK
      THEN SCALE_CHANGE := TRUE;
    WAVE_RANGE := MAX_REGP + MAX_REGN;
    WAVE_INC := (PLOT_HEIGHT - DSP_HEIGHT
                 + MIN_ENV * YCHARSIZE) / WAVE_RANGE;
    WAVE_TOP := ROUND (X_AXIS + WAVE_INC * WAVE_RANGE);
    Y_ZERO   := ROUND (WAVE_TOP - MAX_REGP * WAVE_INC);
    GSLT (6);
    GSMOVE (PLOT_START   ,WAVE_TOP);
    GSDRAW (PLOT_START   ,X_AXIS-20);   (* DRAW Y_AXIS          *)
    GSMOVE (PLOT_START-20,Y_ZERO);
    GSDRAW (L            ,Y_ZERO);      (* DRAW X_AXIS          *)
    GSLTD (6,2,7);
    IF WAVE_RANGE < 16
      THEN K := TRUNC(WAVE_RANGE)
      ELSE K := 16;
    J := TRUNC(WAVE_RANGE / K);
    TH := (WAVE_TOP - X_AXIS) DIV K;
    FOR I := 0 TO K-1 DO
      BEGIN
        GSMOVE (PLOT_START,WAVE_TOP-TH*I);
        GSDRAW (L         ,WAVE_TOP-TH*I);
      END;
    GSLTD (6,0,0);
    CN := WAVE_TOP - YCHAR_D2;
    WRITESTR (DISP_STR,MAX_REGP:-11:0);
    LS := LENGTH(TRIM(DISP_STR)) + 1;
    X := PLOT_START - XCHARSIZE * LS;
    FOR I := 0 TO K-1 DO
      BEGIN
        WRITESTR (DISP_STR,MAX_REGP-REAL(I)*J:LS:0);
        GSCHAR (X,CN-TH*I,LS,DISP_STR(.1.));
      END;
    END;
%PAGE
(*****************************************************************)
(* DRAW THE HORIZONTAL SCALE FOR THE DISPLAY                      *)
(*****************************************************************)
  SCALE_CHANGE := FALSE;           (* RESET SCALE CHANGED FLAG *)
  GSSL (2);                 (* set character size    *)
  TL := T1 + TIME_BIAS;     (* adjust for actual time *)
  TH := T2 + TIME_BIAS;
  IF MODE = $DEBUG          (* IF DEBUG MODE          *)
    THEN BEGIN
      MARK1 := LARGE_TICK1;
      MARK2 := LARGE_TICK2;
      J := 1 + (TL DIV LEVEL_CYCLE);   (* STARTING CYCLE NUMBER  *)
      END                   (* END IF $DEBUG          *)
```

```
      ELSE BEGIN                  (* ELSE NOT $DEBUG     *)
        MARK1 := SMALL_TICK1;
        MARK2 := SMALL_TICK2;
        J := 1 + TL;
        END;                      (* END ELSE NOT $DEBUG  *)

CN := J;
    MARK_MOD := MARK_START MOD MARK_SPCNG;
    WRITESTR (DISP_STR,END_CYCLE:-5);
    LS := LENGTH(TRIM(DISP_STR));
    K := (LS - 1) * XCHARSIZE;
    GSLT (6);
    X := PLOT_START;              (* START OF SCALE COORD *)

FOR I := TL TO TH DO          (* DRAW "TICK" MARKS    *)
      BEGIN
        IF (MODE = $DEBUG) AND    (* IF DEBUG MODE AND    *)
          ((I MOD LEVEL_CYCLE) ^= 0)  (* NOT CYCLE SLOT   *)
          THEN IF XINC > 4        (* THEN: IF LARGE ENOUGH *)
            THEN BEGIN            (* THEN:                *)
              GSMOVE (X,SMALL_TICK1);  (* DRAW SMALL "TICK" MARK *)
              GSDRAW (X,SMALL_TICK2);
              END                 (* END IF THEN          *)
            ELSE                  (* ELSE NOTHING ...     *)
          ELSE BEGIN              (* ELSE:                *)
            IF (CN < MARK_START) OR  (* IF NOT AT 1ST MARK YET *)
              (CN MOD MARK_SPCNG ^= MARK_MOD) (* IF SMALL MARK *)
              THEN BEGIN          (* DRAW SMALL 'TICK' MARK *)
                GSMOVE (X,MARK1);
                GSDRAW (X,MARK2);
                END
              ELSE BEGIN          (* DRAW LARGE 'TICK' MARK *)
                GSMOVE (X,LARGE_TICK1);
                GSDRAW (X,LARGE_TICK2);
                IF (CN MOD HSI = MARK_MOD)  (* IF MAJ SCALE INTERVAL *)
                  THEN BEGIN
                    WRITESTR (DISP_STR,CN:LS);  (* WRITE CYCLE NO. *)
                    GSCHAR (X-K,SCALE_COORD,LS,DISP_STR(.1.));
                    END;
                END;
            CN := CN + 1;         (* INCR CYCLE NUMBER    *)
            END;
        X := X + XINC;            (* INCR X COORDINATE    *)
        END;                      (* END FOR I ...        *)
%PAGE
    IF CYCLE_MARK
      THEN BEGIN
        CN := J;
        GSLTD (6,2,7);
        FOR I := TL TO TH DO      (* DRAW "TICK" MARKS    *)
          IF (MODE ^= $DEBUG) OR  (* IF STROBE MODE OR    *)
            ((I MOD LEVEL_CYCLE) = 0)  (* IF CYCLE SLOT   *)
```

```
        THEN BEGIN
          IF (CN >= MARK_START) AND   (* IF TO 1ST MARK AND    *)
             (CN MOD MARK_SPCNG = MARK_MOD) (* IF LARGE MARK    *)
            THEN BEGIN            (* DRAW LARGE 'TICK' MARK   *)
              X := PLOT_START + (I - TL) * XINC;
              GSMOVE (X,LARGE_TICK2);
              IF SPLIT_TICK
                THEN BEGIN
                  GSDRAW (X,WAVE_TOP);
                  GSMOVE (X,NAMES_BOT);
                  END;
              GSDRAW (X,YMAX_DIMEN);
              END;
          CN := CN + 1;           (* INCR CYCLE NUMBER     *)
          END;                    (* END FOR I ...         *)
     GSLTD (6,0,0);
     END;

MODEL_CHANGE := FALSE;
GSSL (2);                  (* SET CHARACTER SIZE     *)
GSLT (3);                  (* set character size     *)
X := XCHARSIZE;
DISP_STR := 'MODEL: ' || TRIM(SUBSTR(STR(MODEL),1,8));
GSCHAR (BX0+X,CB,LENGTH (DISP_STR),DISP_STR(.1.));
DISP_STR := 'UCODE: ' || TRIM(SUBSTR(STR(UCODE),1,8));
GSCHAR (BX2+X,CB,LENGTH (DISP_STR),DISP_STR(.1.));
TEST_CHANGE := FALSE;
MODE_CHANGE := FALSE;
GSSL (2);                  (* set character size     *)
DISP_STR := 'TEST: ' || TRIM(SUBSTR(STR(TEST),1,8));
GSCHAR (BX1+X,CB,LENGTH (DISP_STR),DISP_STR(.1.));
WRITESTR (DISP_STR,'NSEC/LEVEL: ',NANOS_LEVEL:-4);
GSCHAR (BX3+X,CB,LENGTH (DISP_STR),DISP_STR(.1.));
IF MODE = $DEBUG           (* IF DEBUG MODE          *)
  THEN DISP_STR := 'DEBUG MODE'
  ELSE WRITESTR (DISP_STR,'STROBE ',STROBE_VALUE:4);
GSCHAR (BX5+X,CB,LENGTH (DISP_STR),DISP_STR(.1.));
CHECK_CMPHIT (T1,T2);
GSLT (3);                  (* set characterS YELLOW  *)
GSSL (2);                  (* set character size     *)
DATETIME (DATE,TOD);       (* GET CURRENT DATE / TIME *)
DISP_STR := STR(DATE) || ' ' || SUBSTR(STR(TOD),1,5);
GSCHAR (BX4+X,CB,LENGTH (DISP_STR),DISP_STR(.1.));
 IF DISPLAY_WAVE
   THEN DRAWWAVE (T1,T2)
   ELSE DRAWCHAR (T1,T2);
 GSFRCE;
 CHANGED := FALSE;          (* reset parm changed flag *)
NODRAW :
 CSET_LOADED := TRUE;
 IF QPARM ^= 'D'
```

```
THEN I := FSMODW (200,$OUT,$HIGH,$OFF);
END;                    (* END DRAW_OUTPUT       *)
%PAGE
```

```
While the invention has been described in
terms of a preferred embodiment in a specific
system environment, those skilled in the
art recognize that the invention can be
practiced, with modification, in other and
different operating systems within the spirit and
scope of the appended claims.
```

While the invention has been described in terms of a preferred embodiment in a specific system environment, those skilled in the art recognize that the invention can be practiced, with modification, in other and different operating systems within the spirit and scope of the appended claims.

What is claimed is:

1. Method for analyzing circuit network information graphically on a graphic display device employing a plurality of multi-dimensional visual indicia on the graphic display device, comprising the steps of:
   (a) selecting a multi-dimensional visual indicia representative of select circuit state information;
   (b) sorting the circuit network information and assigning a starting x,y point on the graphic display device to a particular physical position;
   (c) determining a time window of interest; and
   (d) displaying the multi-dimensional visual indicia correlating the time window of interest and the circuit network information.

2. Method as recited in claim 1, further comprising the step of averaging the circuit network information and dynamically presenting multi-dimensional visual indicia on the graphic display device representative of the averaged circuit network information.

3. Method as recited in claim 1, further comprising the step of testing for a transition in the circuit network information and changing display colors in the multi-dimensional visual indicia on the graphic display device on detection of a transition.

4. Method as recited in claim 1, further comprising the step of plotting a line segment value from a last transition in the circuit network information in three-dimensional space as the multi-dimensional visual indicia on the graphic display device.

5. Method as recited in claim 1, further comprising displaying a three-dimensional figure representative of the circuit network information as the multi-dimensional visual indicia on the graphic display device.

6. Method as recited in claim 1, further comprising the step of selecting some circuit network information as the multi-dimensional visual indicia to display on the graphic display device.

7. Method as recited in claim 1, further comprising the step of selecting a perspective to view the multi-dimensional visual indicia on the graphic display device.

8. Method as recited in claim 1, further comprising the step of correlating the time window of interest with a spacial raster display rate to display on the graphic display device.

9. Method as recited in claim 1, further comprising the step of displaying steady state circuit network information by overlaying colors on the graphic display device.

10. Apparatus for analyzing circuit network information graphically on a graphic display device employing a plurality of multi-dimensional visual indicia on the graphic display device, comprising:
    (a) means for selecting a multi-dimensional visual indicia representative of select circuit state information;
    (b) means for sorting the circuit network information and assigning a starting x,y point on the graphic display device to a particular physical position;
    (c) means for determining a time window of interest; and
    (d) means for displaying the multi-dimensional visual indicia correlating the time window of interest and the circuit network information.

11. Apparatus as recited in claim 10, further comprising means for averaging the circuit network information and dynamically presenting multi-dimensional visual indicia on the graphic display device representative of the averaged circuit network information.

12. Apparatus as recited in claim 10, further comprising means for testing for a transition in the circuit network information and changing display colors in the multi-dimensional visual indicia on the graphic display device on detection of a transition.

13. Apparatus as recited in claim 10, further comprising means for plotting a line segment value from a last transition in the circuit network information in three-dimensional space as the multi-dimensional visual indicia on the graphic display device.

14. Apparatus as recited in claim 10, further comprising means for displaying a three-dimensional figure representative of the circuit network information as the multi-dimensional visual indicia on the graphic display device.

15. Apparatus as recited in claim 10, further comprising means for selecting some circuit network information as the multi-dimensional visual indicia to display transparently on the graphic display device.

16. Apparatus as recited in claim 10, further comprising means for selecting a perspective to view the multi-dimensional visual indicia on the graphic display device.

17. Apparatus as recited in claim 10, further comprising means for correlating the time window of interest with a spacial raster display rate to display on the graphic display device.

18. Apparatus as recited in claim 10, further comprising means for displaying steady state circuit network information by overlaying colors on the graphic display device.

19. Method for analyzing circuit network information graphically employing a three dimensional display having a plurality of multi-dimensional visual indicia on the three dimensional display, comprising the steps of:
    (a) selecting a multi-dimensional visual indicia representative of select circuit state information;
    (b) determining a time window of interest; and
    (c) displaying the multi-dimensional visual indicia correlating the time window of interest and the circuit network information on the three dimensional display.

20. Method for analyzing time dependent state information employing a three dimensional display having a plurality of multi-dimensional visual indicia on the three dimensional display, comprising the steps of:
    (a) selecting a multi-dimensional visual indicia representative of the time dependent state information;
    (b) determining a time window of interest; and
    (c) displaying the multi-dimensional visual indicia correlating the time window of interest and the time dependent state information on the three dimensional display.

21. Apparatus for analyzing circuit network information graphically employing a three dimensional display having a plurality of multi-dimensional visual indicia on the three dimensional display, comprising:
    (a) means for selecting a multi-dimensional visual indicia representative of select circuit state information;
    (b) means for determining a time window of interest; and
    (c) means for displaying the multi-dimensional visual indicia correlating the time window of interest and the circuit network information on the three dimensional display.

22. Apparatus for analyzing time dependent state information employing a three dimensional display having a plurality of multi-dimensional visual indicia on the three dimensional display, comprising:
    (a) means for selecting a multi-dimensional visual indicia representative of the time dependent state information;
    (b) means for determining a time window of interest; and
    (c) means for displaying the multi-dimensional visual indicia correlating the time window of interest and the time dependent state information on the three dimensional display.

* * * * *